(12) United States Patent
Hellriegel et al.

(10) Patent No.: US 8,842,430 B2
(45) Date of Patent: Sep. 23, 2014

(54) DATA CENTER

(75) Inventors: Stephen V. R. Hellriegel, Bainbridge Island, WA (US); Mario L. Jaena, Kent, WA (US); Brian D. Koblenz, Seattle, WA (US); David Louis Anderson, Los Altos Hills, CA (US); David Driggers, San Diego, CA (US); Hampton Walker Haddock, Jr., Birmingham, AL (US)

(73) Assignee: Cirrascale Corporation

( * ) Notice: Subject to any disclaimer, the term of this patent is extended or adjusted under 35 U.S.C. 154(b) by 0 days.

(21) Appl. No.: 13/166,786

(22) Filed: Jun. 22, 2011

(65) Prior Publication Data
US 2012/0134104 A1 May 31, 2012

Related U.S. Application Data

(62) Division of application No. 12/347,415, filed on Dec. 31, 2008, now Pat. No. 7,990,710.

(51) Int. Cl.
| H05K 7/20 | (2006.01) |
| G06F 1/16 | (2006.01) |
| G06F 1/18 | (2006.01) |
| H05K 7/14 | (2006.01) |
| G06F 1/20 | (2006.01) |

(52) U.S. Cl.
CPC *G06F 1/20* (2013.01); *G06F 1/183* (2013.01); *H05K 7/1497* (2013.01); *G06F 2200/201* (2013.01); *H05K 7/2079* (2013.01); *H05K 7/20745* (2013.01)
USPC .................................................. 361/679.46

(58) Field of Classification Search
None
See application file for complete search history.

(56) References Cited

U.S. PATENT DOCUMENTS

| 5,830,057 | A |   | 11/1998 | Hunt, Jr. |
| 5,991,163 | A |   | 11/1999 | Marconi et al. |
| 6,801,428 | B2 |   | 10/2004 | Smith et al. |
| 6,819,563 | B1 |   | 11/2004 | Chu et al. |
| 6,836,030 | B2 |   | 12/2004 | Smith et al. |
| 6,867,966 | B2 |   | 3/2005 | Smith et al. |
| 6,909,611 | B2 |   | 6/2005 | Smith et al. |
| 6,981,915 | B2 | * | 1/2006 | Moore et al. ............... 454/184 |
| 7,215,535 | B2 |   | 5/2007 | Pereira |
| 7,511,960 | B2 |   | 3/2009 | Hillis et al. |
| 7,854,652 | B2 |   | 12/2010 | Yates et al. |
| 7,856,838 | B2 | * | 12/2010 | Hillis et al. ................. 62/259.2 |
| 7,883,023 | B1 | * | 2/2011 | Kainer et al. ............... 236/49.3 |
| 2004/0020226 | A1 | * | 2/2004 | Bash et al. .................... 62/229 |
| 2004/0075984 | A1 | * | 4/2004 | Bash et al. .................... 361/695 |

(Continued)

OTHER PUBLICATIONS

Verari Systems, Financial Services Solutions Guide, Jul. 18, 2007.

*Primary Examiner* — Gregory Thompson

(57) ABSTRACT

A data center inside a shipping container having a lower plenum and an upper plenum in its interior, individual computing devices, and a humidity. Humidity inside the container is controlled by a humidity sensing device that reports the humidity level to a central controller. The central controller is connected to a humidity control device and the individual computing devices. Based on the humidity level, the central controller will adjust the output of the humidity control device to maintain the humidity internal to the container at a pre-determined level. The central controller energizes and de-energizes individual computing devices depending on the humidity level inside the container and other factors associated with the operation of computing devices. The central controller is also connected to, and communicates with, an external communication network.

9 Claims, 17 Drawing Sheets

(56) References Cited

U.S. PATENT DOCUMENTS

| | | |
|---|---|---|
| 2004/0100770 A1 | 5/2004 | Chu et al. |
| 2004/0218355 A1* | 11/2004 | Bash et al. ............... 361/690 |
| 2005/0270738 A1 | 12/2005 | Hellriegel et al. |
| 2007/0165377 A1* | 7/2007 | Rasmussen et al. ......... 361/695 |
| 2008/0094797 A1 | 4/2008 | Coglitore et al. |
| 2009/0223240 A1* | 9/2009 | Bean, Jr. ..................... 62/285 |

* cited by examiner

DATA CENTER

RELATED APPLICATIONS

This application is a Divisional of, and claims the benefit of priority to, U.S. Utility patent application Ser. No. 12/347,415 entitled "Data Center", filed Dec. 31, 2008, and currently co-pending.

BACKGROUND OF THE INVENTION

1. Field of the Invention

The present invention is directed generally to a data center and more particularly to a data center housed inside a portable self-contained enclosure, such as a shipping container.

2. Description of the Related Art

Planning and constructing a traditional data center requires substantial capital, planning, and time. The challenges of planning a traditional data center include maximizing computing density (i.e., providing a maximum amount of computing capacity within a given physical space). Further, it may be difficult, if not impossible, to use the space available efficiently enough to provide adequate computing capacity.

Once a data center is constructed, it can be difficult to upgrade to keep up with current technologies. For example, it may be difficult, if not impossible, to expand an existing data center operating at full capacity because the expansion may require additional power and cooling resources, which simply are not available or would be costly to install.

Therefore, a need exists for a means of reducing the capital, planning, and/or time required to implement a data center. A further need exists for a data center that requires less capital, planning, and/or time than a traditional data center. A customizable data center configurable for a particular user's needs is also desirable. A data center capable of integration with an already existing data center is also advantageous. A further need also exists for a data center that requires less time and effort during set up and installation. The present application provides these and other advantages as will be apparent from the following detailed description and accompanying figures.

BRIEF DESCRIPTION OF THE SEVERAL VIEWS OF THE DRAWING(S)

DETAILED DESCRIPTION OF THE INVENTION

Figure 1:
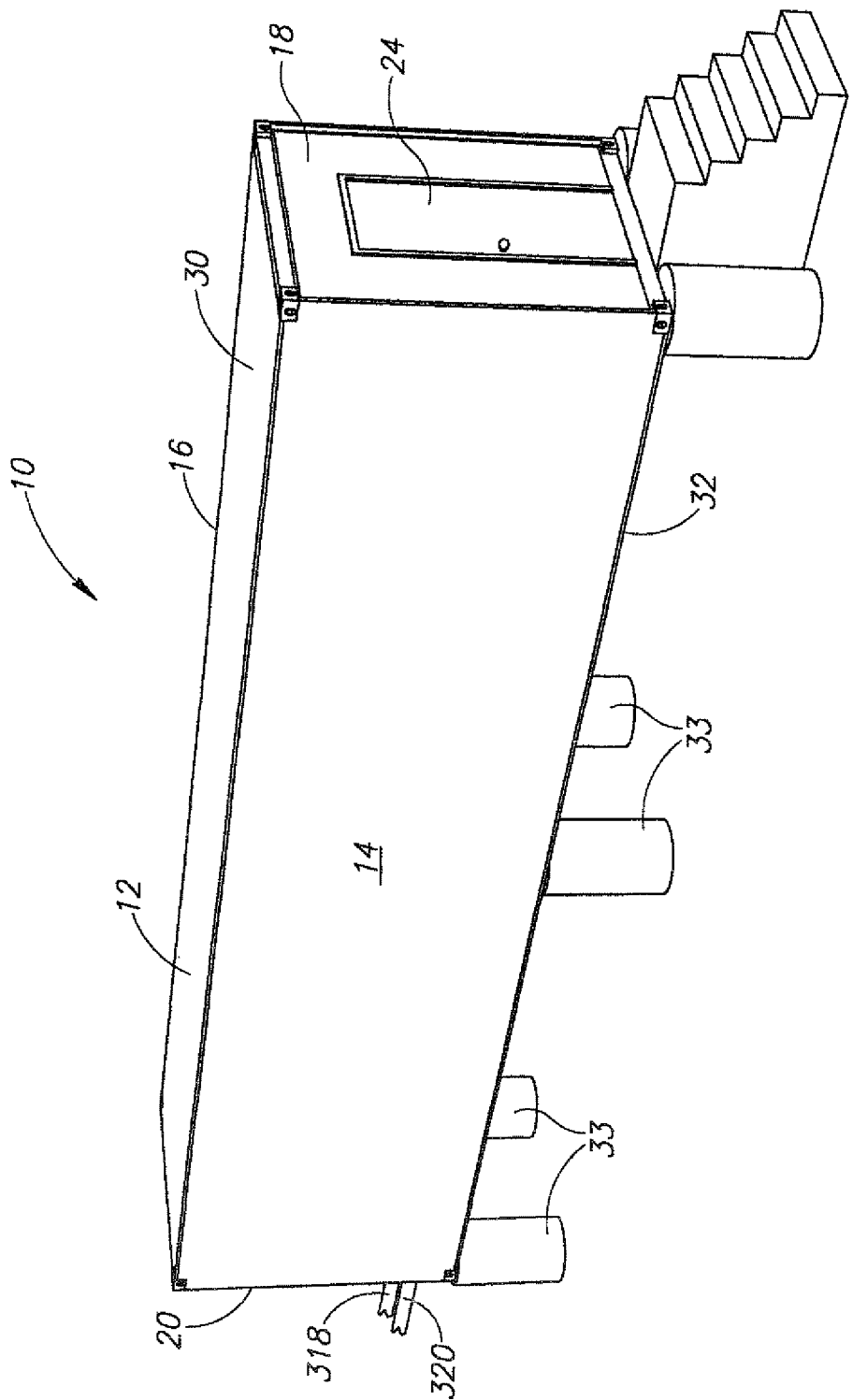
FIG. 1 is a perspective view of a data center housed inside a container.

Referring to FIG. 1, aspects of the present invention relate to a data center 10 housed inside a container 12. The container 12 may be a conventional shipping container of the type typically used to ships goods via a cargo ship, railcar, semi-tractor, and the like. The container 12 is portable and may be delivered to a use site substantially ready for use with minimal set up required. As will be described in detail below, the data center 10 may be preconfigured with desired computer hardware, data storage capacity, and interface electronics. For example, the data center 10 may be configured according to customer requirements and/or specifications.

The data center 10 is completely self contained in the container 12 and may be substantially ready for use immediately following delivery thus reducing the need for on-site technical staff, and in particular embodiments, reducing the need to install and setup computing hardware, route data cables, route power cables, and the like.

As described in detail below, the environment inside the container 12 may be climate controlled to provide a suitable environment for the operation of computing equipment and hardware. For example, the environment inside the container 12 may provide optimal power consumption (including adequate power for lighting), cooling, ventilation, and space utilization. The data center 10 may be configured to provide an efficient self-contained computing solution suitable for applications in remote locations, temporary locations, and the like.

The container 12 has a first longitudinal side portion 14 opposite a second longitudinal side portion 16. The container 12 also includes a first end portion 18 extending transversely between the first and second longitudinal side portions 14 and 16 and a second end portion 20 extending transversely between the first and second side portions 14 and 16. By way of a non-limiting example, each of the first and second longitudinal side portions 14 and 16 may be about 40 feet long and about 9.5 feet tall. The first and second end portions 18 and 20 may be about 8.5 feet wide and about 9.5 feet tall. One of the first and second end portions 18 and 20 may include a personnel door 24. The container 12 also includes a top or roof portion 30 extending transversely between the first and second side portions 14 and 16 and longitudinally between the first and second end portions 18 and 20. The container 12 also includes a bottom or floor portion 32 extending transversely between the first and second side portions 14 and 16 and longitudinally between the first and second end portions 18 and 20. The container 12 may be mounted on pillars 33, blocks, or the like to be elevated above the ground.

Figure 2:
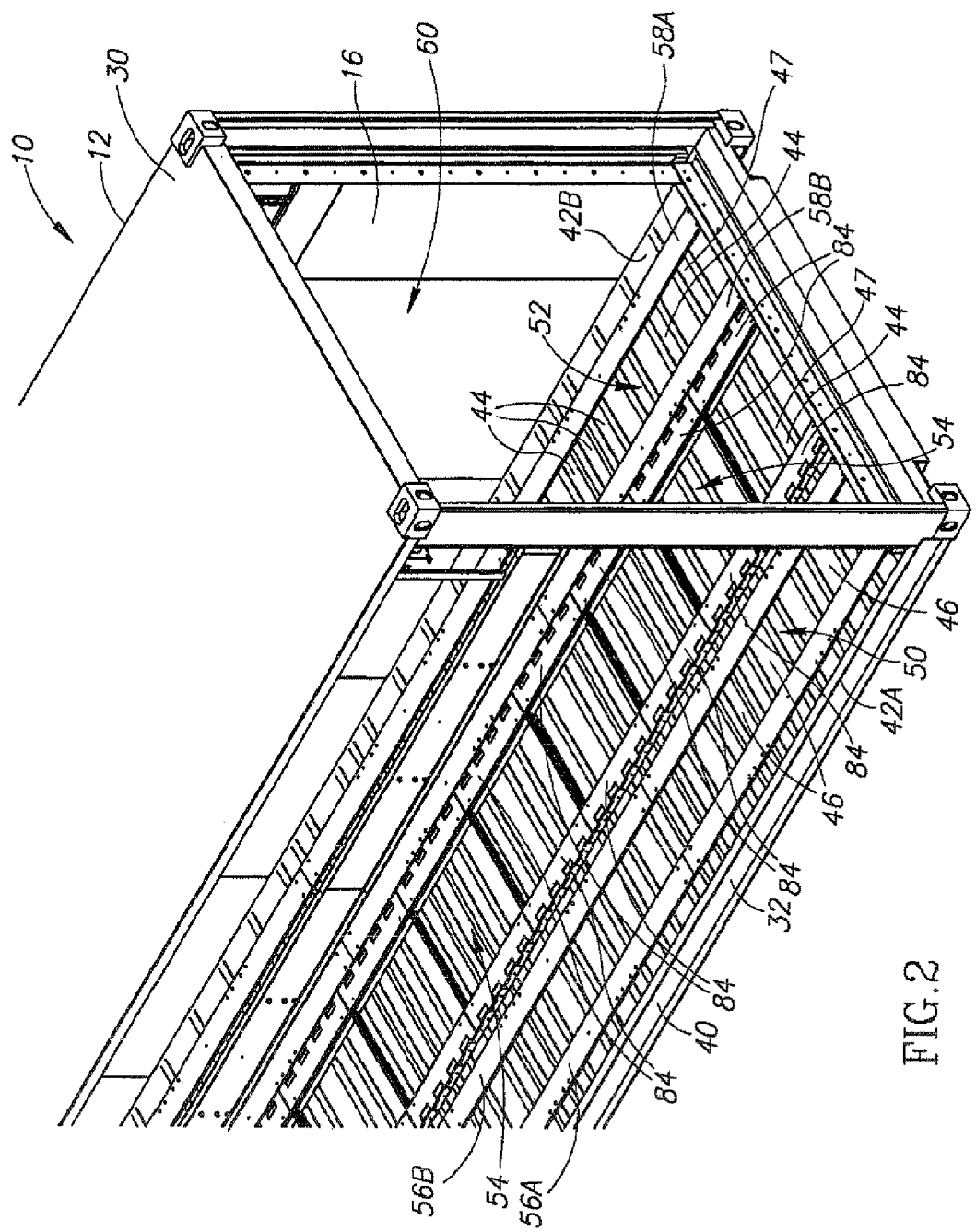
FIG. 2 is an enlarged fragmentary perspective view of the container of FIG. 1 omitting its first longitudinal side portion, front portion, and personnel door to provide a view of its interior portion.

As illustrated in FIG. 2 and appreciated by those of ordinary skill in the art, the floor portion 32 includes a support frame 40 having a first longitudinally extending framing member 42A spaced laterally from a second longitudinally extending framing member 42B. The first and second longitudinally extending framing members 42A and 42B extend along and support the first and second longitudinal side portions 14 and 16 (see FIG. 1), respectively.

The floor portion 32 also includes a plurality of laterally extending framing members 44 that extend transversely between the first and second longitudinally extending framing members 42A and 42B. A plurality of laterally extending interstices or lower plenums 46 are defined between the laterally extending framing members 44. If as illustrated in the embodiment depicted in FIG. 3, the laterally extending framing members 44 have a C-shaped cross-sectional shape having an open inside portion 47, the lower plenums 46 may each include the open inside portions 47 of the C-shaped laterally extending framing members 44. Air may flow laterally within the floor portion 32 inside the lower plenums 46, which include the open inside portion 47 of the C-shaped laterally extending framing members 44. The laterally extending framing members 44 may help guide or direct this lateral airflow.

Each of the laterally extending framing members 44 may be constructed from a single elongated member having a C-shaped cross-sectional shape. However, each of the laterally extending framing members 44 may include three laterally extending portions: a first portion 50, a second portion 52, and a third portion 54. The first portion 50 is adjacent the first longitudinal side portion 14, the second portion 52 is adjacent the second longitudinal side portion 16, and the third portion 54 is located between the first and second portions 50 and 52.

A first pair of spaced apart longitudinally extending support surfaces 56A and 56B are supported by the first portion 50 of the laterally extending framing members 44. A second pair of spaced apart longitudinally extending support surfaces 58A and 58B are supported by the second portion 52 of the laterally extending framing members 44. In the embodiment illustrated, the third portion 54 of the laterally extending framing members 44 is flanked by the longitudinally extending support surfaces 56B and 58B.

Figure 4:
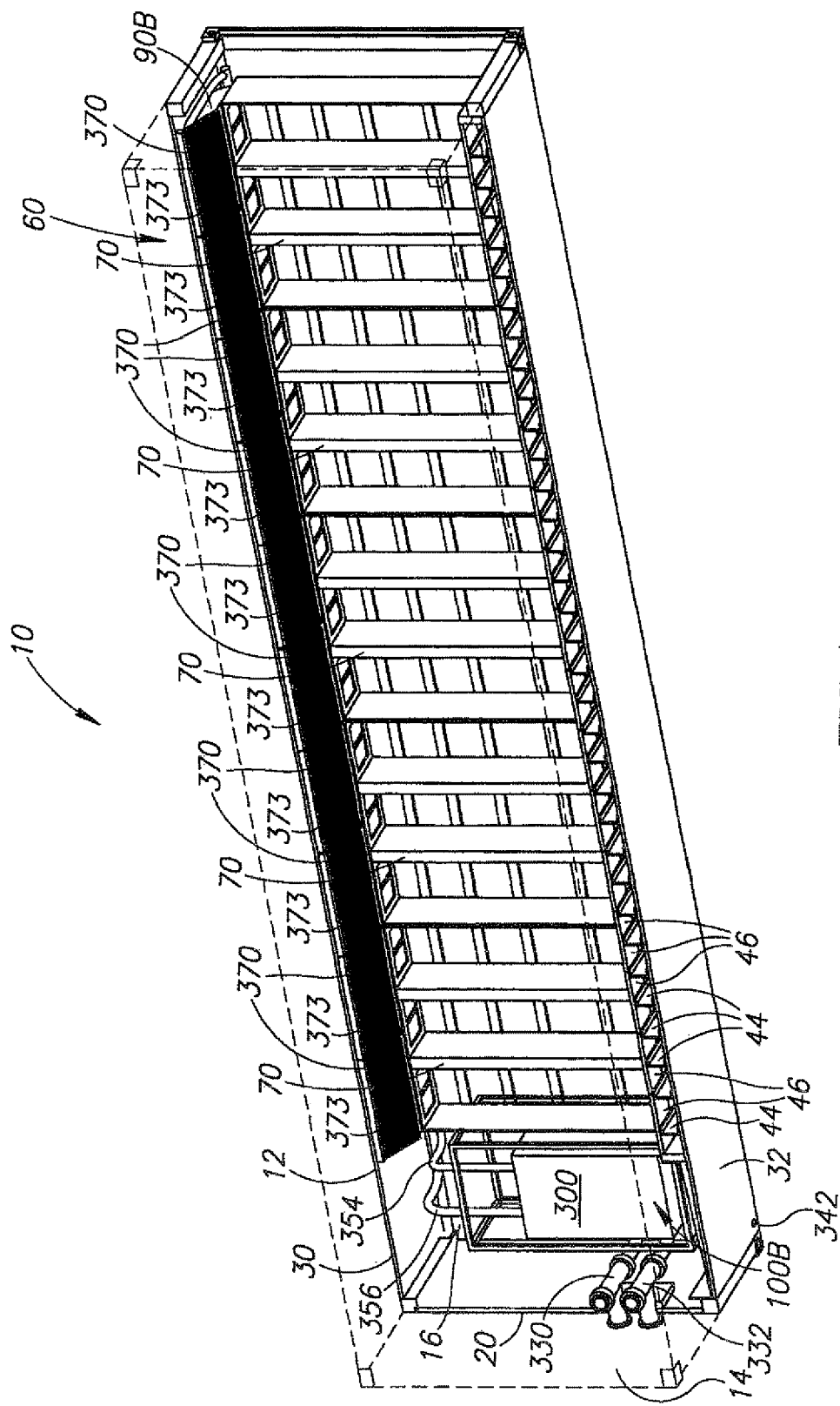
FIG. 4 is an enlarged fragmentary cross-sectional perspective view of the data center of FIG. 1 omitting its electrical system and taken longitudinally through the container.

FIG. 4 provides a longitudinal cross-section of the data center 10. For illustrative purposes, the first end portion 18 and the personnel door 24 have been omitted to provide a better view of the components inside the container 12. The first longitudinal side portion 14, the second longitudinal side portion 16, the first end portion 18 (see FIG. 1), the second end portion 20, the roof portion 30, and the floor portion 32 define an enclosed hollow interior portion 60 accessible to a user (such as a technician) via the personnel door 24 (see FIG. 1).

Figure 3:
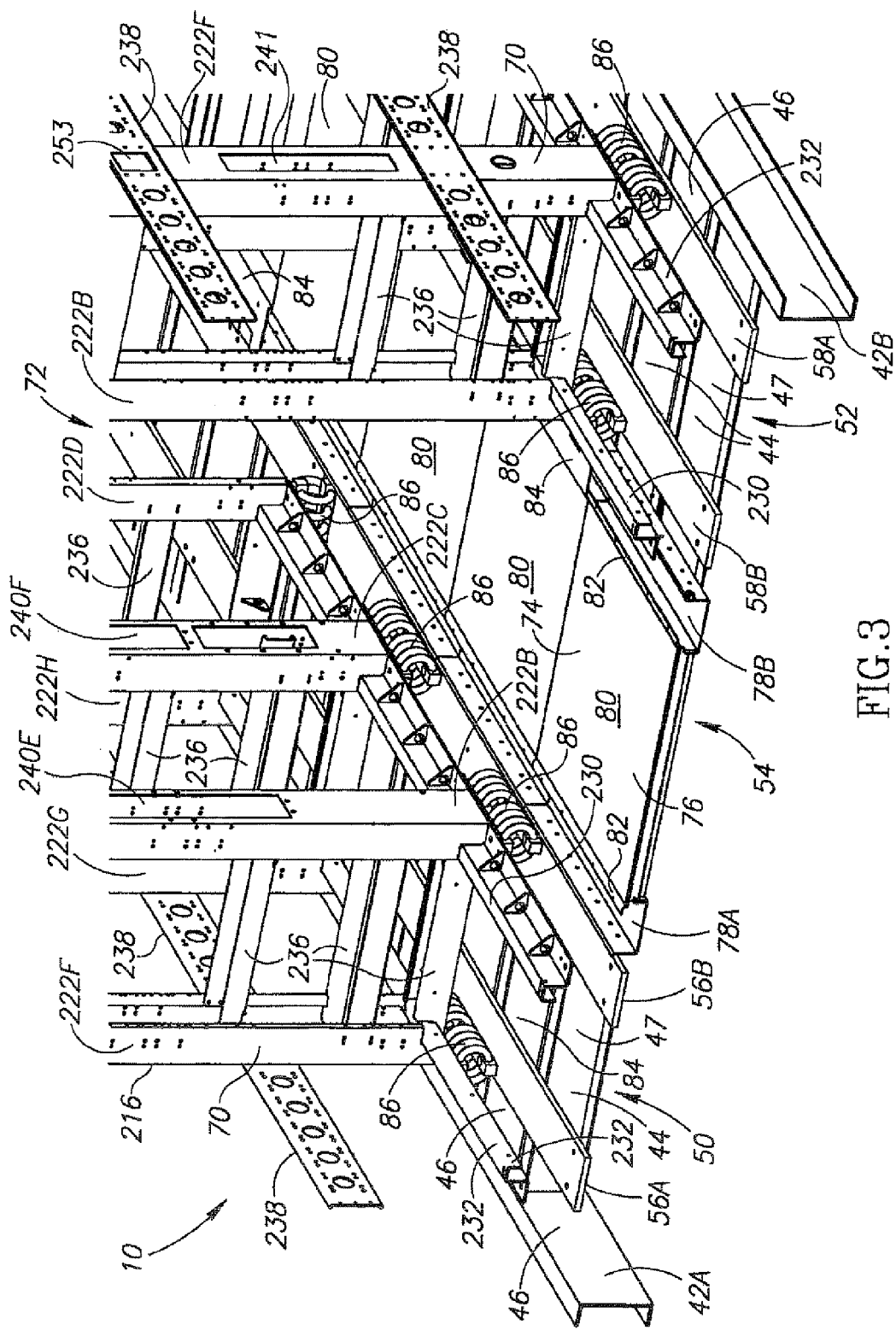
FIG. 3 is an enlarged fragmentary cross-sectional perspective view of the data center of FIG. 1 taken laterally through the container and omitting its first longitudinal side portion, and second longitudinal side portion.
Figure 5:
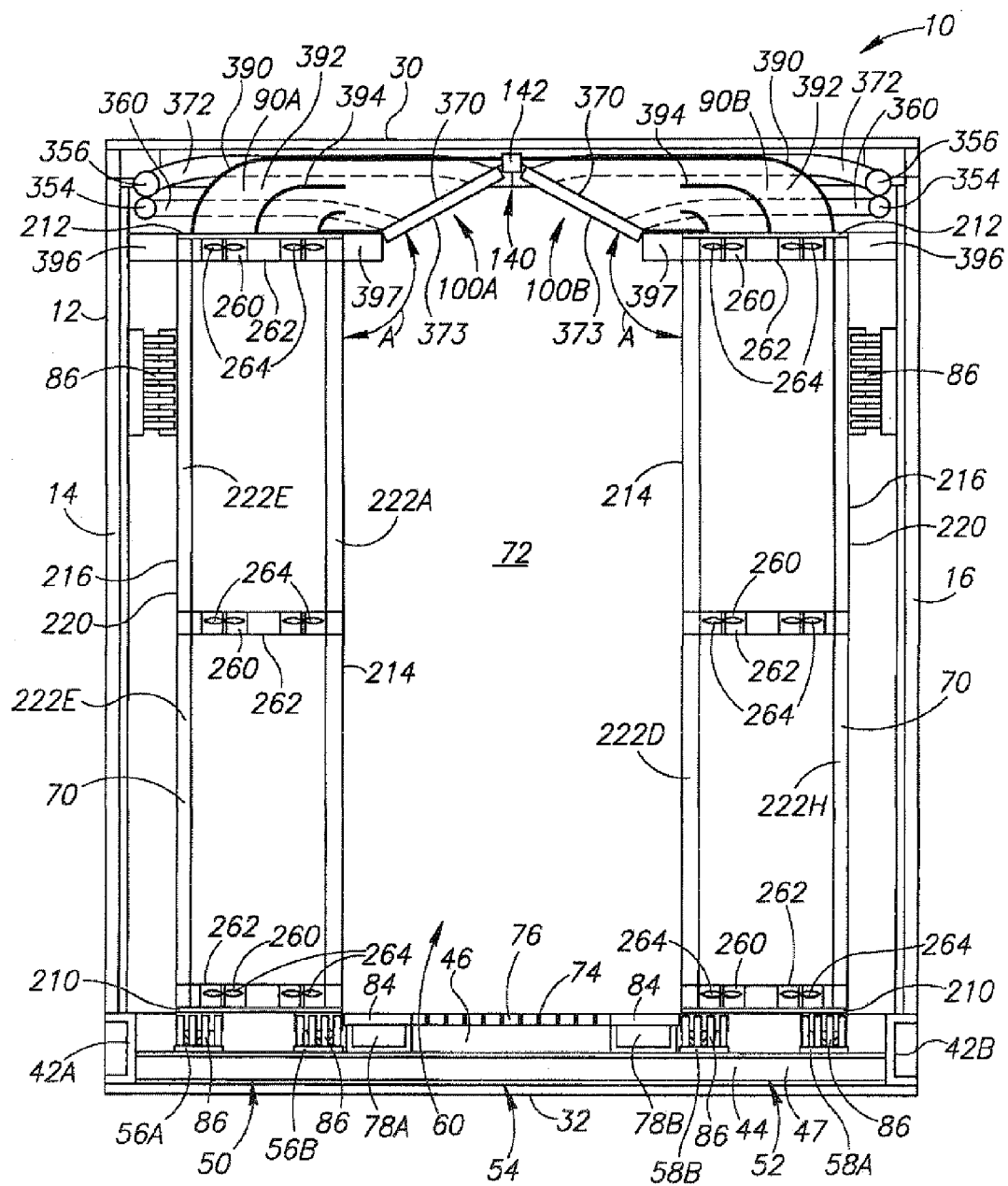
FIG. 5 is an enlarged fragmentary cross-sectional view of the data center of FIG. 1 omitting its electrical system and taken laterally through the container.

Turning to FIGS. 3 and 5, inside the interior portion 60, a plurality of racks or carriages 70 are arranged along each of the first and second longitudinal side portions 14 and 16. The first pair of spaced apart longitudinally extending support surfaces 56A and 56B (see FIGS. 2 and 3) supported by the first portions 50 of the laterally extending framing members 44 support the plurality of carriages 70 (see FIG. 3) extending along the first longitudinal side portion 14. The second pair of spaced apart longitudinally extending support surfaces 58A and 58B supported by the second portions 52 of the laterally extending framing members 44 support the plurality of carriages 70 (see FIGS. 3 and 4) extending along the second longitudinal side portion 16.

A central aisle portion 72 is defined between the carriages 70 and above the third portions 54 of the laterally extending framing members 44. In the central aisle portion 72, the third portions 54 of the laterally extending framing members 44 support a walkway 74. Optionally, the walkway 74 may include a perforated portion 76 and one or more raceways or wire management channels 78A and 78B extending longitudinally alongside the perforated portion 76. Optionally, one or more raceways or wire management channels (not shown) may extend along the roof portion 30 in the central aisle portion 72.

The perforated portion 76 may be constructed using a gas permeable, porous, or perforated material. For example, the perforated portion 76 may be constructed using perforated tiles 80 that permit air to flow through the tiles, from above the tiles to below the tiles and into the lower plenums 46. The perforated tiles 80 may be any standard perforated computer room tiles known in the art. For example, suitable tiles include manufacturing part number 20-0357 sold by Tate Access Floors, Inc. of Jessup, Md.

Each of the wire management channels 78A and 78B has an open top portion 82 and one or more removable cover 84 affixed thereupon. Each of the covers 84 is couplable to the open top portion 82 of each of the wire management channels 78A and 78B. By way of a non-limiting example, the covers 84 may couple to the open top portion 82 of the channels 78A and 78B via a friction connection, snap fit connection, and the like.

Optionally, the carriages 70 may be coupled to the first pair of spaced apart longitudinally extending support surfaces 56A and 56B and the second pair of spaced apart longitudinally extending support surfaces 58A and 58B by isolators or isolating couplers 86 configured to absorb movement of the container 12 relative to the carriages 70. The isolating couplers 86 help prevent damage to any computing equipment mounted to the carriages 70 that may be caused by the movement of the container 12 occurring when the container is moved to a use location, during a seismic event (e.g., an earthquake), and the like. As illustrated in FIG. 5, each of the carriages 70 may also be coupled to one of the first and second longitudinal side portions 14 and 16 by isolating couplers 86 to prevent the carriages from toppling over or bumping into the first and second longitudinal side portions 14 and 16 of the container 12 during transport, a seismic event, and the like.

In the embodiment illustrated in FIG. 4, five carriages 70 are arranged along each of the first and second longitudinal side portions 14 and 16. However, this is not a requirement and different numbers of carriages 70 may be arranged along the first and/or second longitudinal side portions 14 and 16 depending upon the dimensions used to construct both the carriages 70 and the container 12.

As may best be viewed in FIG. 5, a first upper plenum 90A is provided adjacent to the first longitudinal side portion 14 and the roof portion 30 and a second upper plenum 90B is provided adjacent to the second longitudinal side portion 16 and the roof portion 30. Air disposed in the first upper plenum 90A is cooled by a vertical cooling system 100A (described in greater detail below). Air disposed in the second upper plenum 90B is cooled by a vertical cooling system 100B substantially similar to the vertical cooling system 100A. The cooled air flows downwardly from the first and second upper plenums 90A and 90B into the central aisle portion 72 of the interior portion 60 of the container 12 and toward the walkway 74. The central aisle portion 72 essentially serves as a duct to receive and combine the cooled air from both of the vertical cooling systems 100A and 100B. In other words, the vertical cooling systems 100A and 100B flood with cooled air the central aisle portion 72 of the interior portion 60 of the container 12 between the carriages 70. By way of a non-limiting example, the air in the central aisle portion 72 of the interior portion 60 of the container 12 may have a temperature of about 75 degrees F. to about 79 degrees F., and in some implementations about 77 degrees F.

The combined cooled air passes through the perforated portion 76 of the walkway 74 and into the laterally extending lower plenums 46. The cooled air inside the lower plenums 46 flows laterally along the laterally extending framing members 44 toward both the first and second longitudinal side portions 14 and 16. As described below, the cooled air is drawn up into the carriages 70, flows upwardly therethrough, and returns to the first and second upper plenums 90A and 90B above the carriages 70 whereat it is cooled again by the vertical cooling systems 100A and 100B, respectively.

The vertical cooling systems 100A and 100B are mechanically separate and operate independently of one another. If one of the vertical cooling systems 100A and 100B is not functioning, the other functional vertical cooling system continues to cool the air flowing into the central aisle portion 72 and hence into the lower plenums 46 for distribution to both the carriages 70 at the first longitudinal side portion 14 and the carriages at the second longitudinal side portion 16 without regard to which vertical cooling system is not functioning. In this manner, the data center 10 may be cooled by one of the vertical cooling systems 100A and 100B alone. Both of the vertical cooling systems 100A and 100B may be coupled to a common power source or separate power sources. Further, the vertical cooling systems 100A and 100B may be coupled to a common cooled water supply or source 310 (see FIG. 10).

Electrical System

Figure 6:
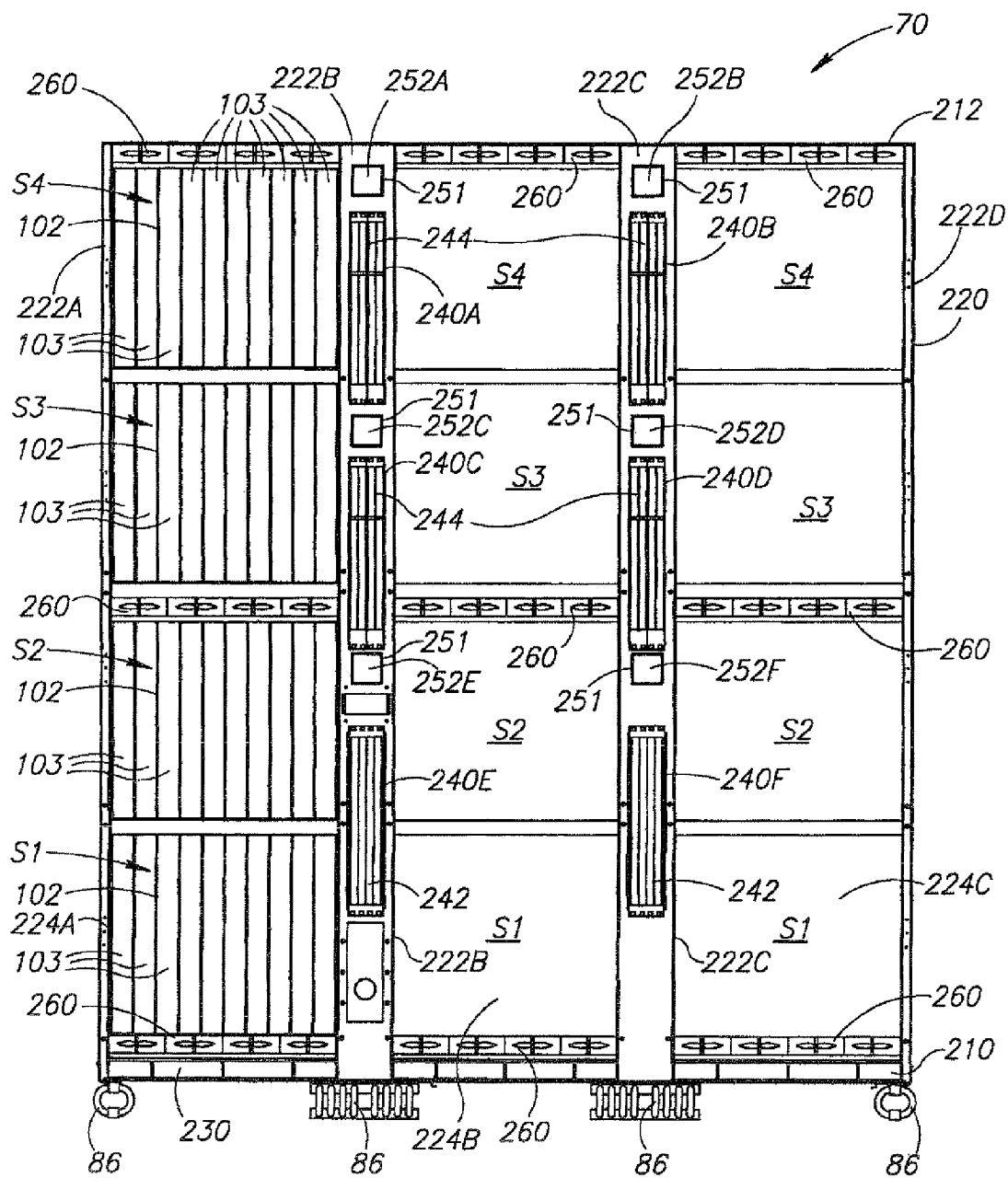
FIG. 6 is a front view of a carriage of the data center of FIG. 1 housing exemplary computing equipment.

FIG. 6 provides a front view of one of the carriages 70 storing computing equipment 102. The particular computing equipment 102 received inside the carriage 70 may include any computing devices (e.g., blade-type servers, backplanes therefore, and the like) as well as any other type of rack mounted electronic equipment known in the art. The structure of the carriages 70 is described in detail below.

Figure 7A:
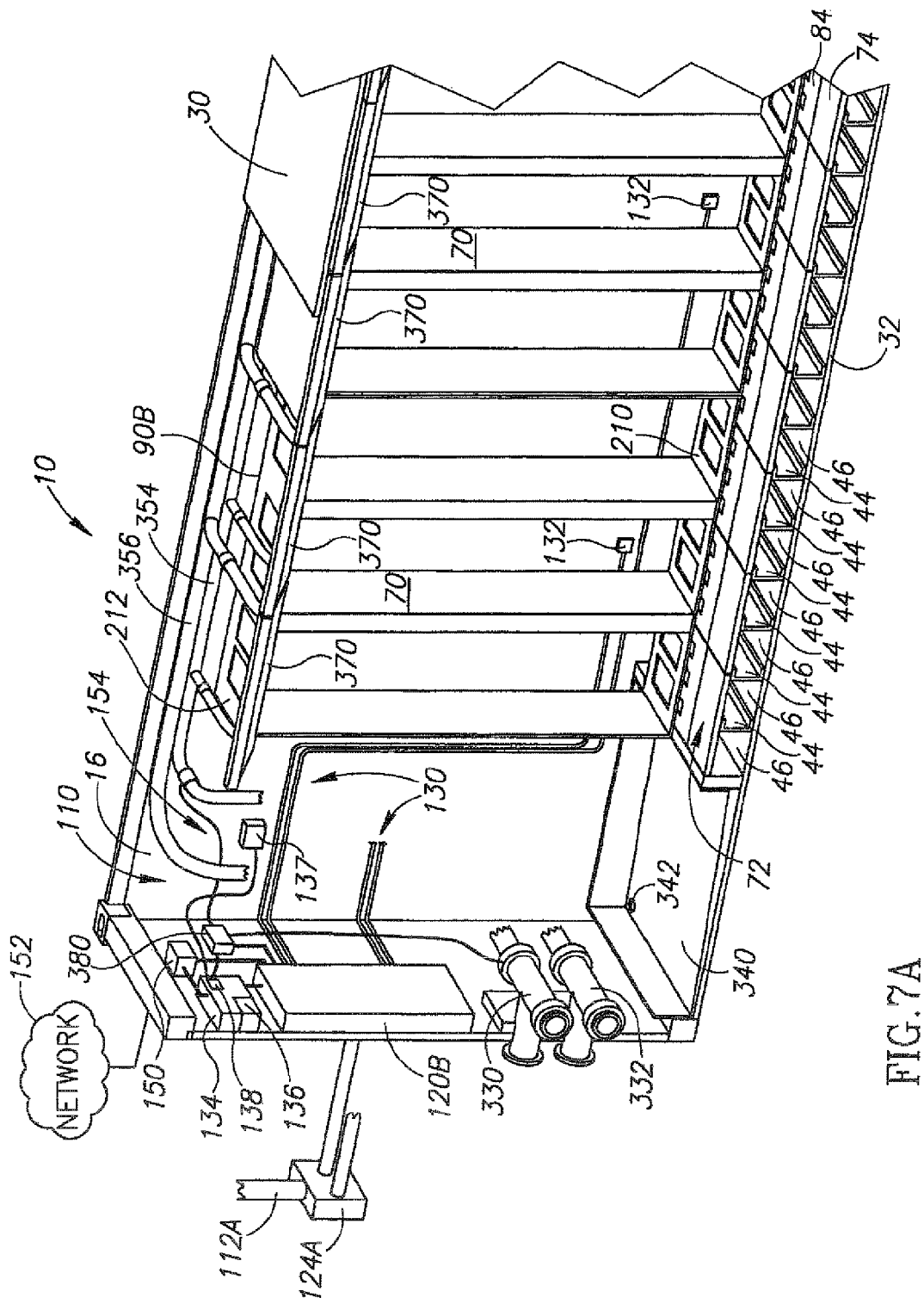
FIG. 7A is an enlarged fragmentary cross-sectional perspective view of the data center of FIG. 1 omitting portions of its vertical cooling system and taken longitudinally through the container.
Figure 7B:
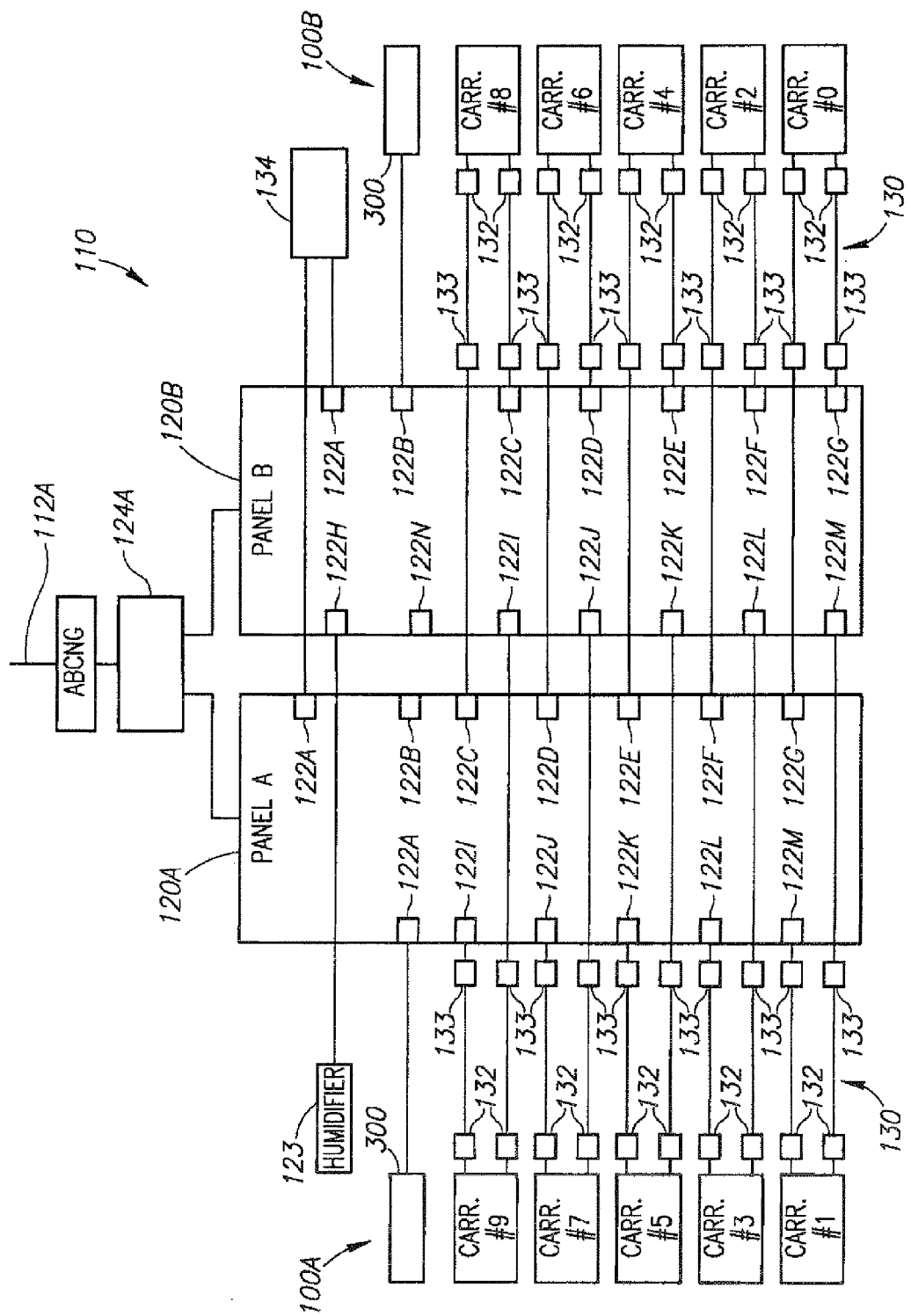
FIG. 7B is an electrical schematic of the electrical system of the data center of FIG. 1.
Figure 8A:
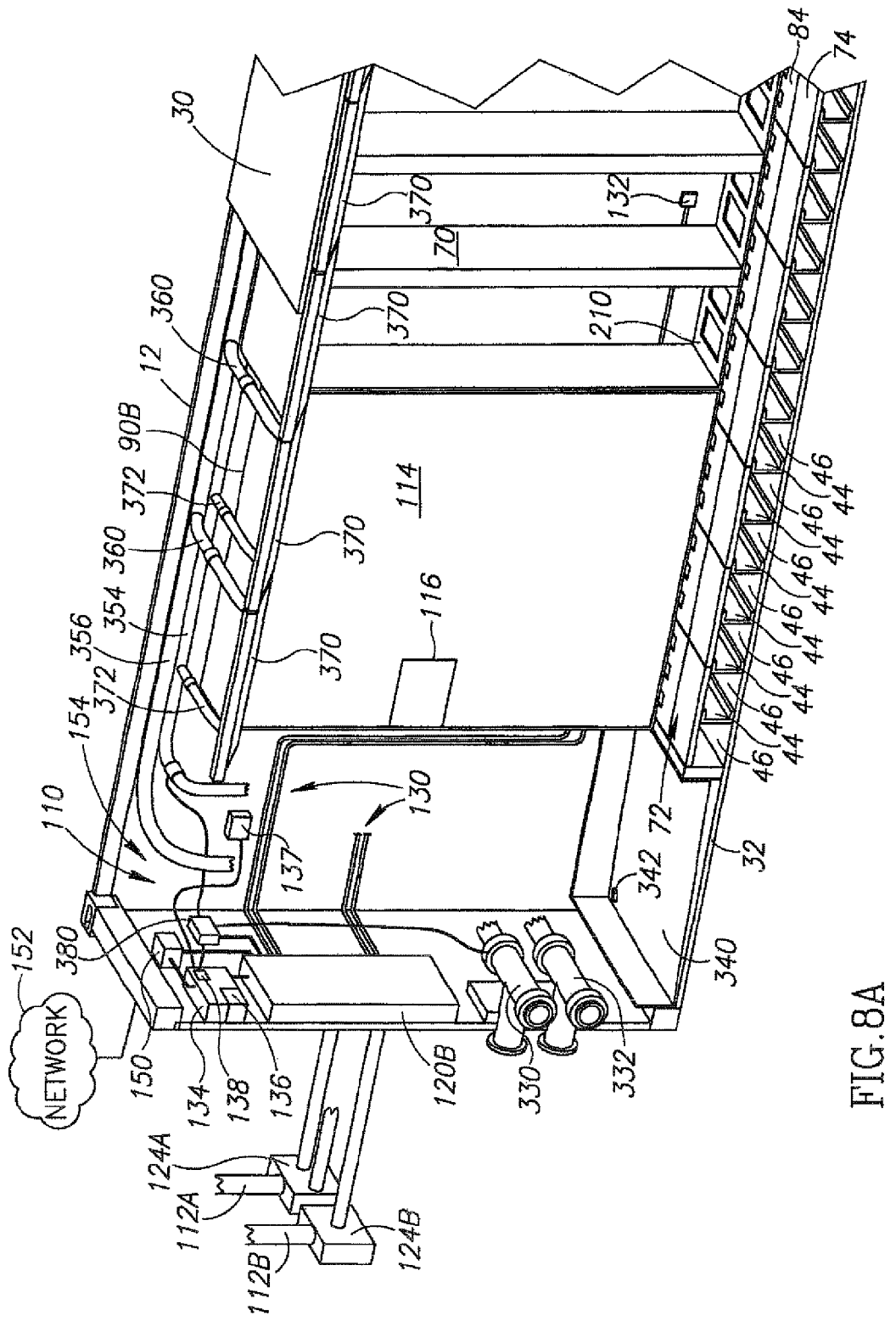
FIG. 8A is an enlarged fragmentary cross-sectional perspective view of an embodiment of the data center of FIG. 1 including an uninterruptible power supply ("UPS") omitting its vertical cooling system and taken longitudinally through the container.

Turning to FIGS. 7A, 7B and 8A, an electrical system 110 supplies electric power to the computing equipment 102 (see FIG. 6) housed by the carriages 70. For ease of illustration, the computing equipment 102 has been omitted from FIGS. 7A and 7B. One or more electric utility lines 112A and 112B (see FIG. 8A) supply power to the electrical system 110. By way of a non-limiting example, each of the electric utility lines 112A and 112B may provide about 600 Amperes WYE of power to the electrical system 110.

The electrical system 110 includes one or more power distribution panels 120A and 120B each having a plurality of circuit breakers 122A-M, and 122A-N, respectively, that protect the various powered components (including the vertical cooling systems 100A and 100B, the computing equipment 102, and the like) within the container 12 from power surges, such as an excess in current draw due to low voltage, a power cable interconnect fault, or any other condition that causes an excess current draw. By way of a non-limiting example, the circuit breakers 122A-M of the power distribution panel 120A and the circuit breakers 122A-N of the power distribution panel 120B may have a fault rating of less than 22 KIA.

The utility line 112A is coupled to the electrical system 110 through a disconnect switch 124A configured to selectively disconnect the flow of current from the utility line 112A to the power distribution panels 120A and 120B. For example, the disconnect switch may be configured for 600 Amps AC. The utility line 112B may be coupled to a separate disconnect switch 124B configured to selectively disconnect the flow of current from the utility line 112B.

In the embodiment depicted, the power distribution panel 120A provides power to the vertical cooling system 100A and the power distribution panel 120B provides power to the vertical cooling system 100B. Each of the power distribution panels 120A and 120B also provides power to the carriages 70 along both the first and second longitudinal side portions 14 and 16 of the container 12. In FIG. 7B, the five carriages 70 extending along the first longitudinal side portion 14 of the container 12 have been labeled "CARR. #9," "CARR. #7," "CARR. #5," "CARR. #3," and "CARR. #1," and the five carriages 70 extending along the second longitudinal side portion 16 of the container 12 have been labeled "CARR. #8," "CARR. #6," "CARR. #4," "CARR. #2," and "CARR. #0."

A plurality of electrical conductors 130 are connected to the circuit breakers 122A-M of the power distribution panel 120A and the circuit breakers 122A-N of the power distribution panel 120B. Each of the electrical conductors 130 coupled to the circuit breakers 122C-G and 1221-M of the power distribution panel 120A extend along the first longitudinal side portion 14 behind the carriages 70 and each of the electrical conductors 130 coupled to the circuit breakers 122C-G and 1221-M of the power distribution panel 120B extend along the second longitudinal side portion 16 behind the carriages 70. The electrical conductors 130 extending along the first and second longitudinal side portions 14 and 16 transport electricity to a plurality of power receptacles 132, which may be mounted to the first and second longitudinal side portions 14 and 16, or the carriages 70. For ease of illustration, in FIG. 7A, electrical conductors 130 conducting electricity to selected power receptacles 132 have been omitted.

Depending upon the implementation details and as appropriate to satisfy power needs, two or more power receptacles 132 may be included for each carriage 70. For ease of illustration, two power receptacles 132 have been illustrated in FIG. 7B for each carriage 70. In the embodiment illustrated, the power receptacles 132 for the carriage "CARR. #8" are coupled one each (via a pair of electrical conductors 130) to the circuit breakers 122C of the power distribution panels 120A and 120B. The power receptacles 132 for the carriage "CARR. #6" are coupled one each (via a pair of electrical conductors 130) to the circuit breakers 122D of the power distribution panels 120A and 120B. The power receptacles 132 for the carriage "CARR. #4" are coupled one each (via a pair of electrical conductors 130) to the circuit breakers 122E of the power distribution panels 120A and 120B. The power receptacles 132 for the carriage "CARR. #2" are coupled one each (via a pair of electrical conductors 130) to the circuit breakers 122F of the power distribution panels 120A and 120B. The power receptacles 132 for the carriage "CARR. #0" are coupled one each (via a pair of electrical conductors 130) to the circuit breakers 122G of the power distribution panels 120A and 120B.

Turning to the carriages 70 along the second longitudinal side portion 16, the power receptacles 132 for the carriage "CARR. #9" are coupled one each (via a pair of electrical conductors 130) to the circuit breakers 122I of the power distribution panels 120A and 120B. The power receptacles 132 for the carriage "CARR. #7" are coupled one each (via a pair of electrical conductors 130) to the circuit breakers 122J of the power distribution panels 120A and 120B. The power receptacles 132 for the carriage "CARR. #5" are coupled one each (via a pair of electrical conductors 130) to the circuit breakers 122K of the power distribution panels 120A and 120B. The power receptacles 132 for the carriage "CARR. #3" are coupled one each (via a pair of electrical conductors 130) to the circuit breakers 122L of the power distribution panels 120A and 120B. The power receptacles 132 for the carriage "CARR. #1" are coupled one each (via a pair of electrical conductors 130) to the circuit breakers 122M of the power distribution panels 120A and 120B.

The electrical system 110 may include a separate power supply 133 (e.g., a 480 VAC power supply) for each of the power receptacles 132. Each of the power supplies 133 may be coupled between one of the circuit breakers 122C-G and 122I-M of the power distribution panels 120A and 120B and the power receptacles 132. The power supplies 133 are coupled to a controller 134 (described below). The controller 134 sends instructions to the power supplies 133 instructing them to provide power to one or more of their respective power receptacles 132 or discontinue sending power to one or more of their respective power receptacles 132. In this manner, the controller 134 controls which of the power receptacles 132 are powered and which are not.

Further, the circuit breaker 122H of the power distribution panel 120A is coupled by an electrical conductor 130 to the vertical cooling systems 100A and the circuit breaker 122B of the power distribution panel 120B is coupled by an electrical conductor 130 to the vertical cooling systems 100B. Optionally, the circuit breaker 122B of the power distribution panel 120A may be coupled to the vertical cooling systems 100B and the circuit breaker 122N of the power distribution panel 120B may be coupled to the vertical cooling systems 100A.

The circuit breaker 122H of the power distribution panel 120B may be coupled by an electrical conductor 130 to an optional humidifier 123. The optional humidifier 123 may include a humidity sensor (not shown) configured to generated a humidity signal indicating the humidity inside the container 12. The controller 134 may be coupled to the optional humidifier 123 and configured to receive the humidity signal and interpret it to determine the humidity inside the container 12. The controller 134 may send instructions to the humidifier 123 instructing it to increase or decrease the humidity inside the container 12 based on the humidity signal. In response to the instructions from the controller 134, the humidifier 123 may increase its water vapor output to increase the humidity inside the air inside the container 12 or reduce its output to decrease the humidity inside the air inside the container 12.

Figure 8B:
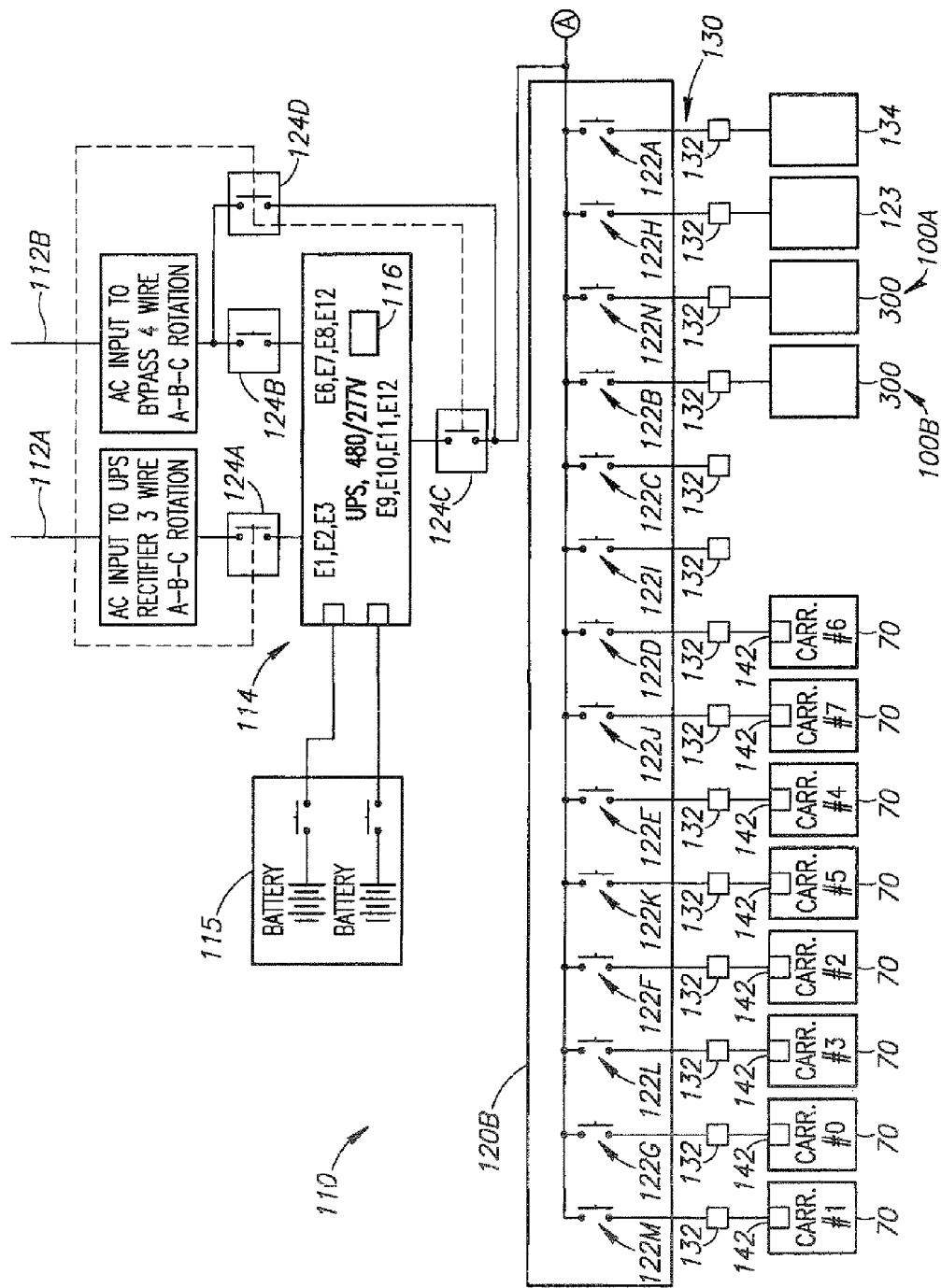
FIGS. 8B and 8C are an electrical schematic of the electrical system of the data center of FIG. 1 including a UPS.
Figure 8C:
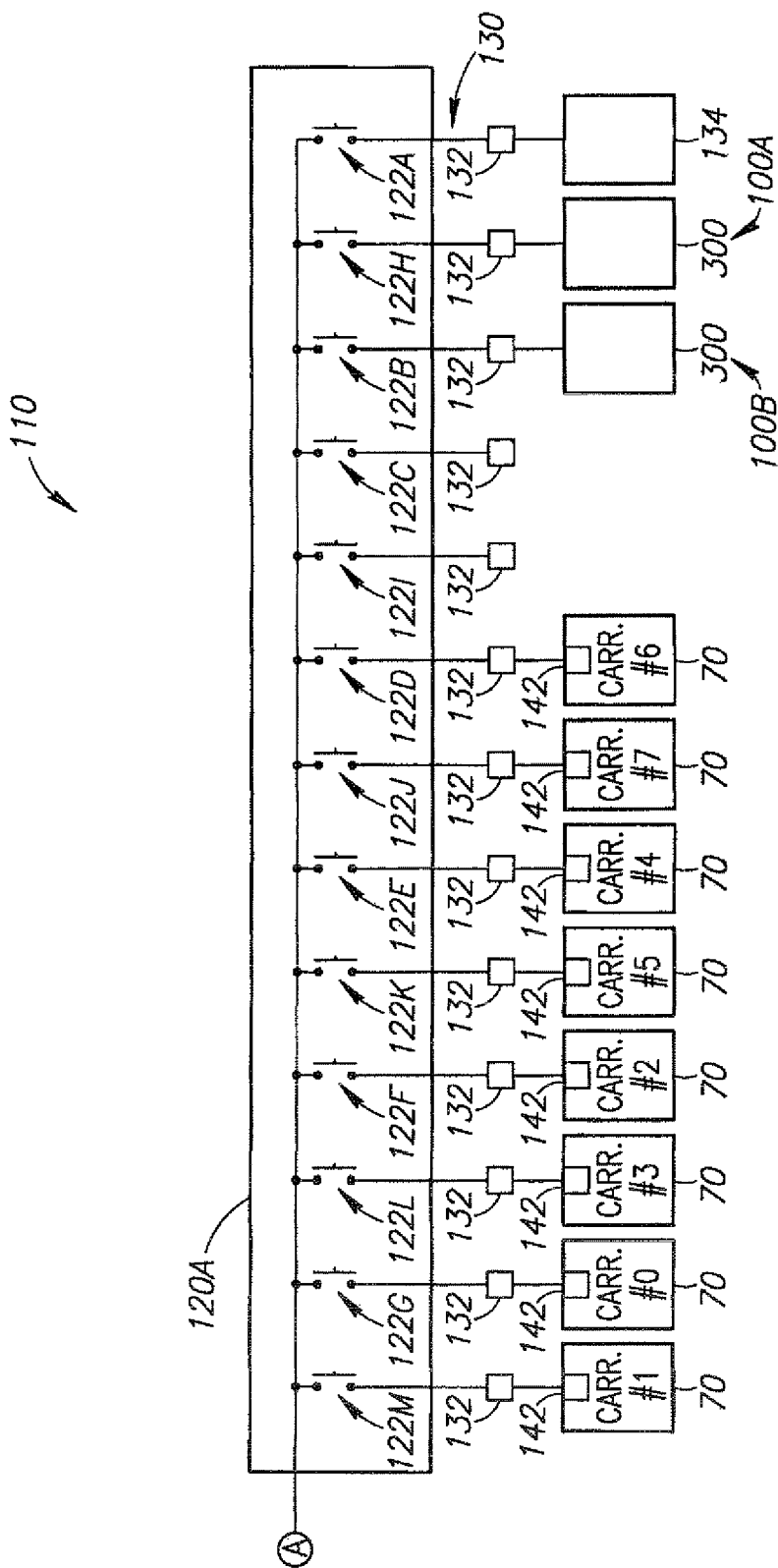

Referring to FIGS. 8A-8C, optionally, the electrical system 110 may include one or more uninterruptible power supplies ("UPS") 114, continuous power supplies ("CPS"), backup batteries, and the like. The UPS 114 provides power to the various powered components of the data center 10, including the vertical cooling systems 100A and 100B, the computing equipment 102, and the like when power to the utility line 112B is interrupted. In the embodiment illustrated, the electrical system 110 includes a single UPS 114 configured to provide power to all of the carriages 70 and other electrical equipment (e.g., the cooling systems 100A and 100B) located inside of the data center 10. The UPS 114 may include one or more batteries 115.

One or more carriages 70 may be omitted from the data center 10 to provide physical space inside the container 12 for the UPS 114. By way of a non-limiting example, a single UPS 114 may fit within the same footprint or spatial envelope occupied by one of the carriages 70. By way of another non-limiting example, a single UPS 114 may fit within the same footprint or spatial envelope occupied by a pair the laterally adjacent carriages 70. In such embodiments, the UPS 114 may fit within the spatial envelope of a first one of the carriages 70 and the batteries 115 of the UPS 114 may occupy the same spatial envelope as a second one of the carriages 70 laterally adjacent to the first. Thus, the data center 10 may be configured based on the user's desires with respect to computing equipment 102 and the number of carriages 70 required thereby versus reliability (i.e., the inclusion or exclusion of one or more optional UPS 114).

The UPS 114 may receive electricity from the utility line 112B and/or the utility line 112A. The UPS 114 is coupled to the power distribution panels 120A and 120B through a disconnect switch 124C. In the implementation illustrated, a UPS bypass switch 124D is provided. During normal operations, the switches 124A, 124B, and 124C are closed and the UPS bypass switch 124D is open. The UPS 114 may be bypassed by opening switches 124A, 124B, and 124C and closing the UPS bypass switch 124D. The controller 134 may be coupled to the switches 124A, 124B, 124C, and 124D and configured to open them to cut off power to the power distribution panels 120A and 120B. The dashed lines in FIG. 8B illustrate control lines coupling the controller 134 to the switches 124A, 124C, and 124D. The control lines carry instructions from the controller instructing the switches 124A, 124C, and 124D to open to cut all power to the power distribution panels 120A and 120B. Another control line (not shown) may be used to connect the controller 134 to the disconnect switch 124B.

The UPS 114 is configured to detect when power to the power distribution panels 120A and 120B has been interrupted and begin discharging power thereto to avoid or reduce the duration of any loss of power to the other components of the electrical system 110. In the embodiment depicted, power received from the utility line 112B (through the disconnect switch 124B) is routed by the UPS 114 through the disconnect switch 124C to the power distribution panels 120A and 120B. When the UPS 114 detects the utility line 112B is no longer carrying an electrical current, the UPS 114 may be configured to begin discharging electricity from the batteries 115 to the power distribution panels 120A and 120B or alternatively, to route power from the utility line 112A to the power distribution panels 120A and 120B.

In the embodiment illustrated in FIGS. 8A-8C, the UPS 114 includes a static switch 116. Upon loss of power in the utility line 112B, the static switch 116 may transfer the load (e.g., the computing equipment 102) to the utility line 112A. If the utility line 112A is also not providing power, the UPS 114 will discharge electricity from the batteries 115 to the power distribution panels 120A and 120B of the electrical system 110. Alternatively, upon loss of power in the utility line 112B, the UPS 114 may begin discharging electricity from the batteries 115 to the power distribution panels 120A and 120B of the electrical system 110. When the UPS 114 has discharged all of its stored energy, the static switch 116 will transfer the load (e.g., the computing equipment 102) to the utility line 112A, Coupling the static switch 116 of the UPS 114 to the utility line 112A provides greater fault tolerance than coupling the UPS 114 to the utility line 112B alone.

Tables A and B below provide a pair of non-limiting examples of from which power source, the utility line 112A, the utility line 112B, and the batteries 115, the static switch 116 may direct power to the power distribution panels 120A and 120B. In Tables A and B, the term "YES" indicates the power source is providing power at the static switch 116 and the term "NO" indicates the power source is not providing power at the static switch 116.

TABLE A

| Utility Line 112A | Utility Line 112B | Batteries 115 | Supplies power to power distribution panels 120A and 120B |
|---|---|---|---|
| YES | YES | YES | Utility Line 112B |
| YES | YES | NO | Utility Line 112B |
| YES | NO | YES | Utility Line 112A |
| YES | NO | NO | Utility Line 112A |
| NO | YES | YES | Utility Line 112B |
| NO | YES | NO | Utility Line 112B |
| NO | NO | YES | Batteries 115 |
| NO | NO | NO | None |

TABLE B

| Utility Line 112A | Utility Line 112B | Batteries 115 | Supplies power to power distribution panels 120A and 120B |
|---|---|---|---|
| YES | YES | YES | Utility Line 112A |
| YES | YES | NO | Utility Line 112A |
| YES | NO | YES | Utility Line 112A |
| YES | NO | NO | Utility Line 112A |
| NO | YES | YES | Batteries 115 |
| NO | YES | NO | Utility Line 112B |
| NO | NO | YES | Batteries 115 |
| NO | NO | NO | None |

Referring to FIG. 5, the electrical system 110 also provides power to a lighting system 140. The lighting system 140 may include a plurality of light emitting diodes ("LEDs") 142 installed inside the interior portion 60 of the container 12 on the roof portion 30 within the central aisle portion 72 above the walkway 74 and between the upper plenums 90A and 90B. The LEDs 142 may provide power and/or space efficiency over other types of light emitting devices. Alternatively, the lighting system 140 may include fluorescent lights (not shown) installed in the central aisle portion 72 above the walkway 74. In such embodiments, the electrical system 110 may include a 2 KVA lighting transformer (not shown). The lighting system 140 may include emergency lights (not shown) located over the personnel door 24 for emergency egress upon loss of power. The controller 134 may be coupled to the lighting system 140 and configured to turn the LEDs 142 on and off.

Communication Network

Returning to FIGS. 7A and 8A, the container 12 may include a network connection 150, such as a modem, router, and the like, coupled to an external network 152, such as the Internet. The network connection 150 may be connected to the external network 152 by any suitable connection known in the art, including a wireless connection, a segment of copper cable, a segment of fiber optic cable, and the like. For example, the container 12 may be coupled to an external network implemented in a neighboring building by one or more network cable connections (e.g., 48 CAT6 GigE network connections).

The container 12 may also include an internal or private network 154, such as a local area network ("LAN"), used to route data within the data center 10 between the various pieces of computing equipment 102. By way of a non-limiting example, the private network 154 may be implemented as an Ethernet network.

Network cabling (not shown) may couple the computing equipment 102 in the carriages 70 to the various network components of the private network 154. The network cabling may include any suitable cables known in the art, including copper cables, fiber optic cables, and the like. The network cabling may be coupled along the first and second longitudinal side portions 14 and 16 as appropriate to effect a connection with the computing equipment 102 residing in the carriages 70. Further, the network cabling may reside inside the wire management channels 78A and 78B. Alternatively, the computing equipment 102 in the carriages 70 may be coupled to the various components of the private network 154 via wireless connections.

The controller 134 is also coupled to the private network 154. The electrical system 110 may also be connected to the private network 154. For example, each of the power sources 133 (coupled to the power receptacles 132) may be coupled to the private network 154. In such embodiments, the controller 134 may send instructions to the power sources 133 over the private network 154. Further, the lighting system 140 may be coupled to the private network 154 and the controller 134 may send instructions to the lighting system 140 over the private network 154. Other components, such as the optional humidifier 123 and the vertical cooling systems 100A and 100B may be coupled to the private network 154 for the purposes of communicating with the controller 134 and/or receiving instructions therefrom.

The network connection 150 may be coupled to the private network 154 for the purposes of providing communication between the private network 154 and the external network 152. Methods and devices for implementing the private network 154, coupling the computing equipment 102 to the private network 154, and coupling the private network 154 to the external network 152 are well-known in the art and will not be described in detail herein.

Controller

As is appreciated by those of ordinary skill in the art, the controller 134 is coupled to and/or includes a memory 136. The memory 136 includes instructions executable by the controller 134. The controller 134 may also be optionally coupled to one or more temperature sensors 137 disposed inside the interior portion 60 of the container 12 each configured to send a temperature signal to the controller 134. The memory 136 may include instructions that when executed by the controller 134 instruct the controller to interpret the temperature signal received from each of the temperature sensors 137 to obtain a temperature measurement. The memory 136 may also store the temperature measurement(s) obtained from the temperature signal(s), the temperature signal received from each of the temperature sensors 137, and the like.

The controller 134 may control both the computing equipment 102 (see FIG. 6) and the environment inside the container 12 over the private network 154. In embodiments in which the controller 134 is coupled to the network connection 150 to the external network 152, one or more remote computing devices (not shown) coupled to the external network 152 may communicate with the controller 134. For example, the remote computing devices may receive temperature information from the controller 134. Similarly, the remote computing devices may receive humidity information from the controller 134 that the controller received from the optional humidifier 123. Further, the remote computing devices may send instructions to the controller 134 instructing it to send instructions to the optional humidifier 123 to increase or decrease the humidity inside the container 12. The remote computing devices may also instruct the controller 134 to send instructions powering up or powering down selected power sources 133 (coupled to selected power receptacles 132). Further, the remote computing devices may also instruct the controller 134 to turn on or off the LEDs 142 of the lighting system 140.

The controller 134 may monitor environmental systems inside the container 12. For example, the vertical cooling systems 100A and 100B may each include a cooling system processor or controller 380 (described below). The controller 134 may be coupled to the cooling system controller 380 for the purposes of receiving information (e.g., alerts, warnings, system faults, and the like) therefrom. The controller 134 may send the information it receives to the remote computing device(s). For example, the controller 134 may transmit an alert to the remove computing device(s) indicating a problem has occurred (e.g., the flow of cooled water has stopped, the temperature of the flow of refrigerant is too high to adequately cool the computing equipment 102, and the like). Further, the controller 134 may send instructions to the cooling system controller 380 instructing it to operate or not operate based on the temperature inside the container 12.

The memory 136 may include instructions for monitoring the electrical system 110 and instructing the controller 134 to report information related to power availability and consumption to the remote computing device(s) (not shown) coupled to the external network 152. Further, the controller 134 may receive instructions from the remote computing device(s), such as an instruction to power down the electrical system 110 (e.g., open switches 124A, 124B, 124C, and 124D), power selected power sources 133 (coupled to one or more power receptacles 132), turn off the power to selected power sources 133 (coupled to one or more power receptacles 132) and the like.

The controller 134 may monitor and/or control the computing equipment 102 (see FIG. 6). For example, the memory 136 may include instructions for monitoring the UPS 114, individual pieces of computing equipment 102 (e.g., individual blade servers), and the like. Further, the controller 134 may receive instructions from the remote computing device(s), instructing the controller to turn individual pieces of computing equipment 102 on or off, provide data thereto, and the like.

The controller 134 may include a user interface 138 configured to display the temperature measurement(s) obtained from the temperature signal received from each of the temperature sensors 137, and any data received from other systems inside the container 12.

Carriage

Figure 9:
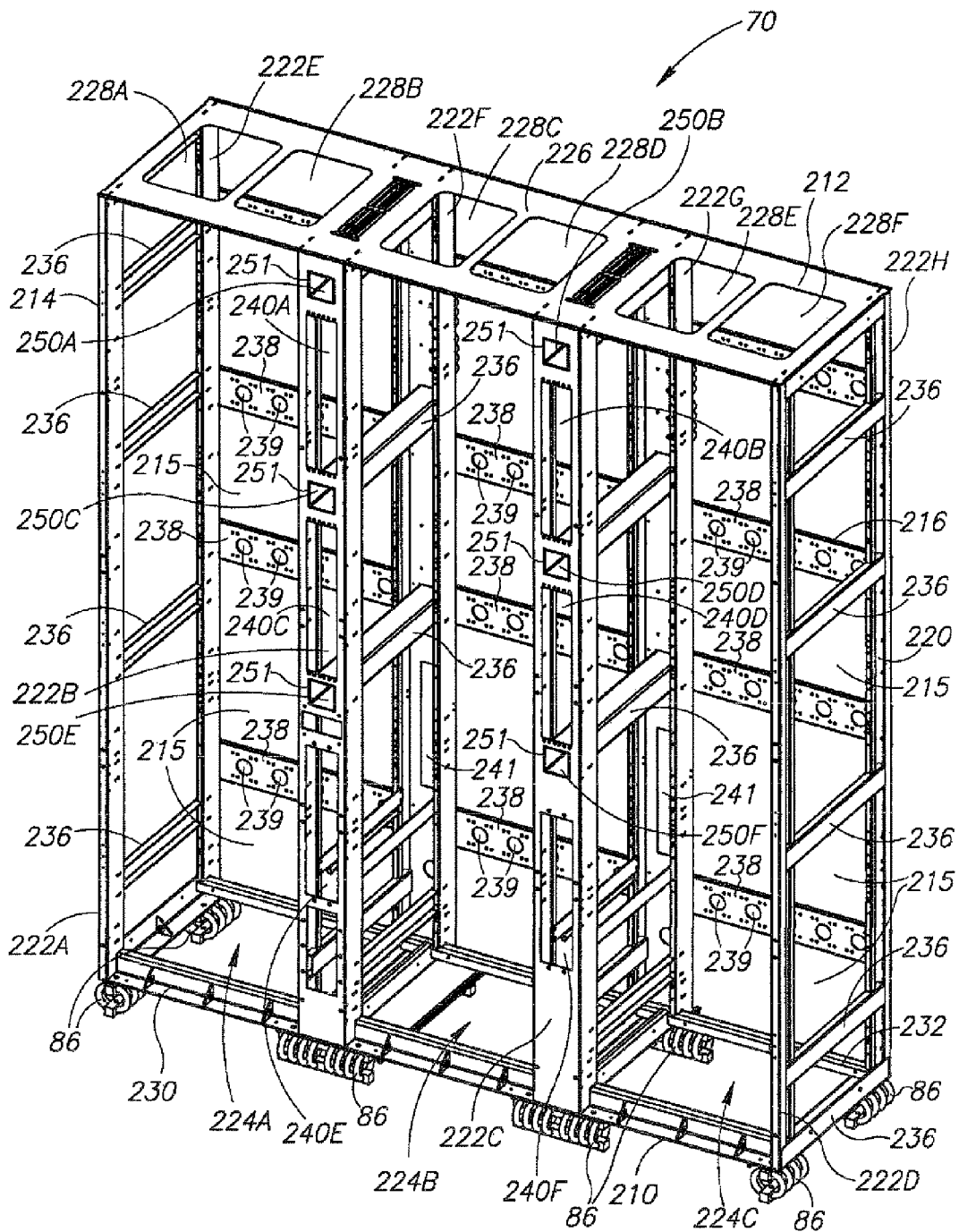
FIG. 9 is a perspective view of the carriage of FIG. 5 omitting the exemplary computing equipment.

An exemplary embodiment of the carriage 70 is provided in FIGS. 5, 6, and 9. As mentioned above, the carriage 70 is configured to store computing equipment 102, which may include a plurality of computing devices (e.g., blade-type servers) as well as any other type of rack mounted electronic equipment known in the art. The carriage 70 has a substantially open base portion 210 opposite a substantially open top portion 212. The carriage 70 also has a substantially open front portion 214 into which computing equipment 102, fans, cabling, rack mountable equipment, accessories, and the like are received for storage and use therein. Opposite the open front portion 214, the carriage 70 has a back portion 216.

Cabling and wiring, such as electrical wiring, communication cables, and the like, may enter the carriage 70 through the back portion 216, which may be open and/or may include one or more apertures 215 configured to permit one or more cables or wires to pass therethrough. As mentioned above, the electrical conductors 130 and optional communication cabling (not shown) may extend along the first and second longitudinal side portions 14 and 16. Further, the power receptacles 132 (see FIG. 7) are positioned adjacent to the back portions 216 of the carriages 70 along the first and second longitudinal side portions 14 and 16. Such power receptacles 132 and communication cabling may be coupled to the computing equipment 102 in the carriage 70 through its back portion 216.

As is appreciated by those of ordinary skill in the art, an amount of computing equipment 102 housed in the interior portion 60 of the container 12 is determined at least in part by the number of carriages 70 and the capacity of each to house computing equipment 102. The carriage 70 includes a frame 220 to which computing equipment 102, fans, cabling, rack mountable equipment, accessories, and the like may be mounted or otherwise attached. The frame 220 is configured to permit air to flow into the open base portion 210, up through the carriage 70 through and around the computing equipment 102 and other items therein, and out the open top portion 212.

The frame 220 includes a plurality of spaced apart upright support members 222A-H, defining one or more upright equipment receiving areas 224A-C. The embodiment depicted has three equipment receiving areas 224A-C, defined by four upright support members 222A-D arranged along the front portion 214 of the carriage 70 and four upright support members 222E-H arranged along the back portion 216 of the carriage 70. Those of ordinary skill in the art appreciate that carriages having a different number of upright equipment receiving areas may be constructed by applying ordinary skill in the art to the present teachings and such embodiments are within the scope of the present teachings.

The upright support members 222A-H are coupled together at the open top portion 212 of the carriage 70 by a vented top plate 226 having apertures 228A-F in communication with the equipment receiving areas 224A-C through which heated air may exit the equipment receiving areas 224A-C and be passed to the corresponding first or second upper plenum 90A or 90B positioned thereabove. The upright support members 222A-H are coupled together at the open base portion 210 along the front portion 214 of the carriage 70 by a front rail 230 and at the open base portion 210 along the back portion 216 of the carriage 70 by a back rail 232.

The four upright support members 222A-D aligned along the front portion 214 of the carriage 70 may be coupled to the four upright support members 222E-H aligned along the back portion 216 of the carriage 70 by any desired number of front-to-back extending members 236. The members 236 may provide structural stability to the carriage 70. Further, the members 236 may provide attachment points to which computing equipment 102, fans, cabling, rack mountable equipment, accessories, and the like may be coupled. Further, the upright support members 222E-H along the back portion 216 may be coupled together by any number of members 238 extending therebetween. The members 238 may provide stability and/or attachment points to which computing equipment 102, fans, cabling, rack mountable equipment, accessories, and the like may be coupled. Optionally, apertures 239 in the members 238 are configured to provide throughways for wiring, cabling, and the like.

The upright support members 222A-D along the front portion 214 of the carriage 70 may include openings 240A-F each configured to receive computing equipment, such as a rectifier, network switching device (e.g., routers), and the like. In the embodiment illustrated in FIG. 6, two of the openings 240E and 240F each house a rectifier 242 and four of the openings 240A-D each house a network switching device 244. By way of an example, the rectifier 242 may be configured to rectify from about 480 V to about −48 V. Referring to FIG. 7B, the power receptacle 132 coupled to the power distribution panel 120A may be coupled to one of the rectifiers 242 and the power receptacle 132 coupled to the other power distribution panel 120B may be coupled to the other of the rectifiers 242. In this manner, each of the rectifiers 242 receives power from a different power distribution panel 120A or 120B.

Turning to FIG. 9, optionally, the upright support members 222E-H along the back portion 216 of the carriage 70 may include one or more openings 241 substantially similar to the openings 240A-F and aligned with one or more corresponding opening 240A-F of the upright support members 222A-D.

One or more open-ended conduits 250A-F may extend between the upright support members 222A-D along the front portion 214 and the upright support members 222E-H along the back portion 216. Each of these conduits 250A-F has an open front end portion 251 opposite and open back end portion 253 (see FIG. 3). Each conduit 250A-F may be configured to provide a throughway for cabling (not shown) from the front portion 214 of the carriage 70 to the back portion 216 of the carriage 70. By way of a non-limiting example, the cabling may include Category 6 ("Cat-6") cable for Ethernet connections. Turning to FIG. 6, one or more network connections 252A-F, such as an Ethernet jack, may be located adjacent the front portion 214 of the carriage 70 and coupled to a cables (not shown) extending through the conduits 250A-F.

As illustrated in FIG. 6, the equipment receiving areas 224A-C may each be divided into four sections "S1-S4" (for a total of 12 sections per carriage 70). Each section "S1-S4" may use twenty-four Ethernet connections; however, this is not a requirement. By way of a non-limiting example, each blade slot may have two Ethernet ports. However, as is appreciated by those of ordinary skill in the art, each blade slot may include more than two Ethernet ports. For example, more than one Ethernet port may be located in a front portion of a blade server and more than one Ethernet port may be located in a back portion of a blade server. The equipment receiving areas 224A-C are not limited to use with blade servers having a particular number of Ethernet ports. Further, the equipment receiving areas 224A-C are not limited to use with blade servers having Ethernet ports and may be used with blade servers having other types of communication ports.

As illustrated in FIGS. 5 and 6, a plurality of air moving assemblies 260 each having a plurality of air moving devices 264 (e.g., fans) oriented to blow air upwardly through the equipment receiving areas 224A-C, are mounted therein between the upright support members 222A-H of the carriage 70. Each of the air moving assemblies 260 includes a frame 262 configured to be mounted inside one of the equipment receiving areas 224A-C. The frame 262 houses the plurality of air moving devices 264, each of which is oriented to flow air in substantially the same upward direction. In the embodiment depicted in FIGS. 5 and 6, the carriage 70 includes nine air moving assemblies 260. However, this is not a requirement. The number of air moving assemblies mounted inside each of the equipment receiving areas 224A-C may be determined based at least in part on the amount of air circulation required to cool the computing equipment received therein. The air moving assemblies 260 each receive power from the power conductors 130 (see FIG. 7) carrying power to the carriages 70 and powering the computing equipment 102 housed therein.

The upright equipment receiving areas 224A-C may be customized to receive a predetermined collection of computing equipment (e.g., a predetermined number of blade servers). For example, the upright equipment receiving areas 224A-C may be configured to receive blade servers 103 in an upright orientation. Alternatively, the upright equipment receiving areas 224A-C may be configured to receive blade servers in a horizontal orientation.

In some embodiments, standard 19" rack mount computer gear (not shown) may be mounted inside the upright equipment receiving areas 224A-C. The fans inside the rack mount computer gear will draw air into the upright equipment receiving areas 224A-C from the central aisle portion 72 of the interior portion 60 of the container 12. This air will pass through the rack mount computer gear, be heated thereby, and exit from the rack mount computer gear adjacent to the back portion 216 of the carriage 70. The heated air may exit the rack mount computer gear inside the carriage 70 or between the back portion 216 of the carriage 70 and an adjacent one of the first and second longitudinal side portions 14 and 16. In such embodiments, the air moving assemblies 260 will direct the heated up inside the carriage 70 upwardly toward the open top portion 212 of the carriage 70. Further, the air moving assemblies 260 will help draw heated air outside the carriage 70 into the upright equipment receiving areas 224A-C whereat the air moving assemblies 260 will direct the heated up upwardly toward the open top portion 212 of the carriage 70. The rack mount computer gear may be mounted inside the upright equipment receiving areas 224A-C in any orientation. For example, the rack mount computer gear may be mounted inside the upright equipment receiving areas 224A-C in a manner resembling blade servers. Furthermore, an alternate embodiment of the carriage 70 may used, in which the rack mount computer gear may be mounted to extend longitudinally inside the container 12.

The isolating couplers 86 may be coupled to the upright support members 222A-H along the base portion 210 of the carriage 70. Alternatively, the isolating couplers 86 may be mounted to the front rail 230, the back rail 232, and/or the members 236 located along the base portion 210 of the carriage 70. As may best be viewed in FIG. 5, the isolating couplers 86 may also couple one or more of the upright support members 222E-H to one of the first and second longitudinal side portions 14 and 16 of the container 12.

Vertical Cooling System

Referring to FIG. 5, as mentioned above, the vertical cooling system 100A cools air flowing up through the carriages 70 arranged along the first longitudinal side portion 14 and the vertical cooling system 100B cools air flowing up through the carriages 70 arranged along the second longitudinal side portion 16. The vertical cooling system 100B is substantially identical to the vertical cooling system 100A. Therefore, for illustrative purposes, only the vertical cooling system 100B will be described in detail.

Figure 10:
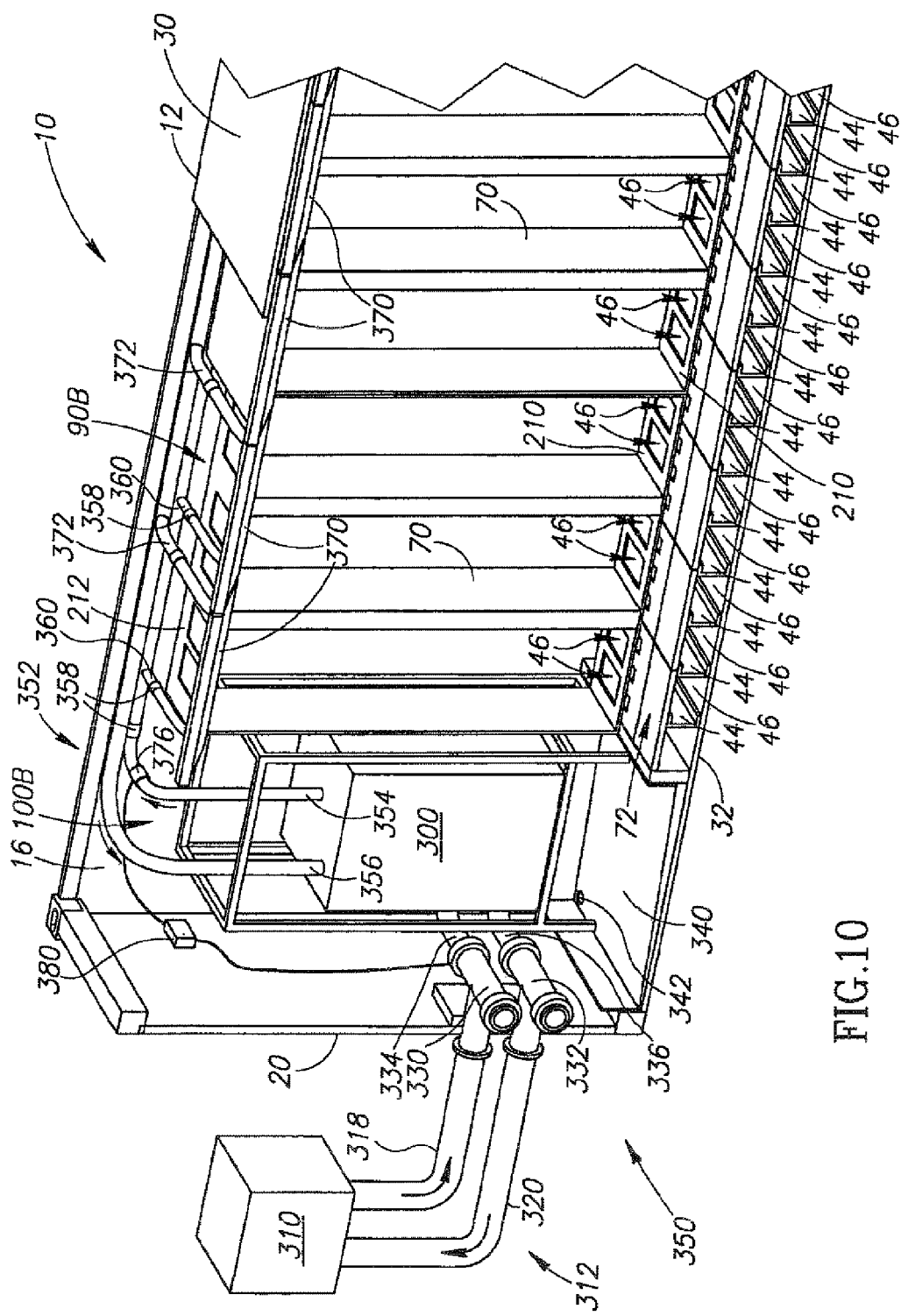
FIG. 10 is an enlarged fragmentary cross-sectional perspective view of the data center of FIG. 1 omitting its electrical system and taken longitudinally through the container.

Turning to FIG. 10, the vertical cooling system 100B includes two fluid flows: a flow of refrigerant and a flow of chilled or cooled water. Within the vertical cooling system 100B, the flow of refrigerant is cooled by transferring its heat to the flow of cooled water. The vertical cooling system 100B includes a water/refrigerant heat exchanger 300 configured to transfer heat from the flow of refrigerant to the flow of cooled water. The water/refrigerant heat exchanger 300 may be implemented using any heat exchanger known in the art. By way of a non-limiting example, a suitable heat exchanger includes a Liebert XDP Water-Based Coolant Pumping Unit, which may be purchased from Directnet, Inc. doing business as 42 U of Broomfield, Colo.

The flow of cooled water is received from an external supply or source 310 of cooled water as a continuous flow of cooled water. By way of a non-limiting example, the flow of cooled water received may have a temperature of about 45 degrees Fahrenheit to about 55 degrees Fahrenheit. Optionally, the flow of cooled water may reside in a closed loop 312 that returns the heated previously cooled water to the external source 310 of cooled water to be cooled again. The closed loop 312 and the water/refrigerant heat exchanger 300 are spaced apart from the carriages 70 and the refrigerant is brought thereto. Thus, the closed loop 312 flow of cooled water and the water/refrigerant heat exchanger 300 are segregated from the computing equipment 102 of the data center 10.

The flow of cooled water is transported to the container 12 by a first water line 318 and is transported away from the container 12 by a second water line 320. The container 12 includes a T-shaped inlet valve 330 that directs a portion of the flow of cooled water received from the first water line 318 to each of the vertical cooling systems 100A and 100B (see FIG. 5). The container 12 includes a T-shaped outlet valve 332 that directs the flow of cooled water received from both of the vertical cooling systems 100A and 100B (see FIG. 5) to the second water line 320.

An inlet pipe 334 is coupled between one outlet port of the inlet valve 330 and the water/refrigerant heat exchanger 300 of the vertical cooling system 100B. The inlet pipe 334 carries a portion of the flow of cooled water to the water/refrigerant heat exchanger 300. A similar inlet pipe (not shown) is coupled between the other outlet port of the inlet valve 330 and the water/refrigerant heat exchanger 300 of the vertical cooling system 100A.

An outlet pipe 336 is coupled between the water/refrigerant heat exchanger 300 of the vertical cooling system 100B and one inlet port of the outlet valve 332. The outlet pipe 336 carries the flow of cooled water from the water/refrigerant heat exchanger 300 to the outlet valve 332. A similar outlet pipe (not shown) is coupled between the water/refrigerant heat exchanger 300 of the vertical cooling system 100A and the other inlet port of the outlet valve 332.

The flow of cooled water flowing within the inlet pipe 334 may cool the inlet pipe below the condensation temperature of moisture in the air within the interior portion 60 of the container 12. Thus, water may condense on the inlet pipe 334 and drip therefrom. Similarly, the flow of cooled water flowing within the outlet pipe 336 may cool the outlet pipe below the condensation temperature of moisture in the air within the interior portion 60 of the container 12 causing water to condense on the outlet pipe and drip therefrom.

A basin or drip pan 340 may be positioned below the inlet and outlet pipes 334 and 336. Any condensed water dripping from the inlet and outlet pipes 334 and 336 may drip into the drip pan 340. The drip pan 340 includes an outlet or drain 342 through which condensed water exits the drip pan 340. The drain 342 may extend through the floor portion 32 of the container 12 and may be in open communication with the environment outside the container 12. As is appreciated by those of ordinary skill in the art, external piping, hoses, and the like may be coupled to the drain for the purposes of directing the condensed water away from the container 12.

Together the inlet pipe 334 and drip pan 340 form a passive dehumidification system 350 that limits the humidity inside the container 12 without consuming any additional electrical power beyond that consumed by the vertical cooling systems 100A and 100B (see FIG. 5). In some implementations, the passive dehumidification system 350 includes the outlet pipe 336. The amount of dehumidification provided by the passive dehumidification system 350 may be determined at least in part by the surface area of the components (e.g., the inlet pipe 334, the outlet pipe 336, the water/refrigerant heat exchanger 300, the inlet valve 330, the outlet valve 332, and the like) upon which water condenses.

Within the vertical cooling system 100B, the flow of refrigerant flows through a closed loop 352. The closed loop 352 includes a refrigerant supply manifold 354 and a refrigerant return manifold 356. The refrigerant supply manifold 354 carries cooled refrigerant to a plurality of supply conduits 360, each coupled to one of a plurality of refrigerant/air heat exchangers 370. In the embodiment illustrated, two heat exchangers 370 are provided for each carriage 70. However, this is not a requirement. A plurality of return conduits 372, each coupled to one of the plurality of heat exchangers 370, carry heated refrigerant from the plurality of heat exchangers 370 to the refrigerant return manifold 356. Because the embodiment illustrated includes two heat exchangers 370 for each carriage 70, the plurality of supply conduits 360 and the plurality of return conduits 372 each include ten conduits. The refrigerant return manifold 356 carries heated refrigerant received from the heat exchangers 370 back to the water/refrigerant heat exchanger 300 to be cooled again by the flow of cooled water therein.

The refrigerant supply manifold 354, supply conduits 360, the refrigerant return manifold 356, and return conduits 372 may include one or more flow regulators or valves 358 configured to control or restrict the flow of the refrigerant therethrough. In the embodiment depicted in FIG. 10, the refrigerant supply manifold 354 includes one valve 358 before the first supply conduit 360 regulating the flow of refrigerant into the supply conduits 360. In the embodiment depicted in FIG. 10, the supply conduits 360 each include one valve 358 regulating the flow of refrigerant to each of the heat exchangers 370. By selectively adjusting the flow of refrigerant through the valves 358, the amount of cooling supplied to each of the heat exchangers 370 may be adjusted.

The vertical cooling system 100B may include one or more temperature sensors 376 coupled to refrigerant supply manifold 354, supply conduits 360, the refrigerant return manifold 356, and/or return conduits 372. Each of the temperature sensors 376 may be used to monitor the temperature of the flow of refrigerant and generate a temperature signal. As mentioned above, the vertical cooling system 100B may include the cooling system controller 380, which may be coupled to the inlet valve 330 and the temperature sensor(s) 376. In such embodiments, the cooling system controller 380 is configured to increase or decrease a flow rate of the cooled water through the inlet valve 330 based upon the temperature signal(s) received from the temperature sensor(s) 376 for the purpose of decreasing or increasing the temperature of the flow of refrigerant within the closed loop 352 of the vertical cooling system 100B. In this manner, the temperature of the flow of refrigerant within the closed loop 352 may be adjusted by modifying the flow rate of the cooled water used to cool the flow of refrigerant.

If any of the refrigerant leaks from the vertical cooling system 100B, it does so in a gas or vapor form. Thus, even if a refrigerant leak occurs, it does not leak or drip onto the computing equipment 102. The refrigerant supply manifold 354, supply conduits 360, the refrigerant return manifold 356, and return conduits 372 in which the refrigerant circulates have a temperature above the condensation temperature of the moisture in the air within the interior portion 60 of the container 12. Thus, water does not condense on the refrigerant supply manifold 354, supply conduits 360, the refrigerant return manifold 356, and return conduits 372. As a result, the flow of refrigerant does not expose the computing equipment 102 to dripping water (from condensation).

Referring to FIG. 4, each of the heat exchangers 370 has a coil assembly 373. The refrigerant flows from the supply conduits 360 into each of the heat exchangers 370 and circulates through its coil assembly 373. The air above the carriages 70 is warm, having been heated by the computing equipment 102. The heated air travels upward through the heat exchangers 370 and is cooled by the refrigerant. As may best be viewed in FIGS. 4 and 5, each of the heat exchangers 370 is implemented as a radiator style evaporator with its coil assembly 373 arranged at an angle relative to the front portion 214 and the open top portion 212 of the carriages 70. As is appreciated by those of ordinary skill in the art, the coil assembly 373 has one or more cooling surfaces (not shown) whereat heat is exchanged between the air external to the coil assembly 373 and the refrigerant flowing inside the coil assembly 373. The coil assembly 373 of the heat exchangers 370 may be angled to maximize an amount of cooling surface for the space available for positioning of the heat exchangers, thereby providing a maximum amount of cooling capacity. For example, an inside angle "A" defined between the front portion 214 of the carriages 70 and the coil assembly 373 may range from about 144 degrees to about 158 degrees. Thus, an angle of about 144 degrees to about 158 degrees may be defined between the coil assembly 373 and the open top portions 212 of the carriages 70.

The cooling capacity of the heat exchanger 370 may also depend at least in part on the amount of refrigerant flowing in its coil assembly 373. As mentioned above, by adjusting the valves 358, the amount of refrigerant flowing from each of the supply conduits 360 into each of the heat exchangers 370 may be adjusted. In this manner, the cooling capacity of the vertical cooling system 100B may be customized for each carriage 70, a portion of each carriage, and the like. Further, the cooling capacity may be determined at least in part based on the amount of heat expected to be produced by the computing equipment 102 mounted within each of the carriages, portions of the carriages, and the like. By way of a non-limiting example, the flow of refrigerant from the supply conduits 360 into the heat exchangers 370 may be customized for a particular distribution of computing equipment 102 (e.g., blade servers) within the container 12. Further, the valves 358 in the refrigerant supply manifold 354 may be used to control the flow of refrigerant to all of the heat exchangers 370 of the vertical cool system 100B. Similarly, a valve (not shown) in the refrigerant return manifold 356 may be used to restrict the flow of refrigerant from all of the heat exchangers 370 of the vertical cool system 100B.

A plurality of bent ducts or conduits 390 may be coupled between each of the heat exchangers 370 and at least a portion of the open top portion 212 of an adjacent carriage 70 to direct heated air rising from the carriage 70 into the heat exchanger 370. In the embodiment illustrated, one bent conduit 390 is coupled between a single heat exchanger 370 and a portion (e.g., approximately half) of the open top portion 212 of an adjacent carriage 70. Each bent conduit 390 has a bent portion 392 and defines a bent travel path for the heated air expelled from the carriage 70 into the heat exchanger 370. By directing the heated air rising from the carriage 70 along the roof portion 30 of the container 12, the bent portions 392 help prevent the formation of a back pressure in the upper plenums 90A and 90B along the roof portion 30 that could push the heated air back into the open top portions 212 of the carriages 70. In the embodiment depicted, the bend conduit 390 includes an internal baffle 394 that bifurcates the bent conduit 390 along the bent travel path.

A sealing member 396 is positioned between the back portions 216 of the carriages 70 and the first and second longitudinal side portions 14 and 16. Similarly, a sealing member 397 is positioned between the front portions 214 of the carriages 70 and the heat exchangers 370. The sealing members 396 and 397 help seal the upper plenums 90A and 90B from the remainder of the interior portion 60 of the container 12. The sealing members 396 and 397 may be constructed from any suitable material known in the art including foam.

The air cooled by the heat exchangers 370 is pushed therefrom by the air moving assemblies 260 and flows downwardly from the angled heat exchangers 370 toward the walkway 74 on the floor portion 32 of the container 12. As discussed above, the walkway 74 includes the perforated portion 76 that permits air to flow therethrough and into the lower plenums 46. If the laterally extending framing members 44 are implemented with a C-shaped cross-sectional shape, air may flow laterally inside the open inside portion 47 of the laterally extending framing members 44. In other words, the open inside portion 47 of the C-shaped laterally extending framing members 44 may be considered part of an adjacent lower plenum 46.

Once inside one of the lower plenums 46, the air may flow beneath the carriages 70. Because the laterally extending framing members 44 extend from the beneath the walkway 74 to beneath the carriages 70 arranged along both the first and second longitudinal side portions 14 and 16, air is directed laterally by the laterally extending framing members 44 from beneath the walkway 74 toward and below the carriages 70. Once beneath the carriages 70, the air is drawn upward by the air moving assemblies 260 of the carriages and into the carriages 70, and through and around the computing equipment 102. As the air is heated by the computing equipment 102, the heated air rises up through the carriage 70, and into the bent conduit 390, which directs the heated air into the heat exchangers 370 associated with the carriage to be cooled again.

As mentioned above, each of the carriages 70 includes air moving devices 264 (see FIG. 5). An amount of power consumed by the air moving devices 264 to adequately cool the computing equipment 102 may be determined at least in part by how well air flows from the carriages 70 and into the heat exchangers 370. Thus, the shape of the bent conduits 390 in the upper plenums 90A and 90B may determine at least in part the amount of power consumed by the air moving devices 264. Thus, the bent conduits 390 may be configured to reduce or minimize the amount of power consumed by the air moving devices 264.

If the container 12 is located in an environment in which the air outside the container has a temperature suitable for cooling the computing equipment 102 (see FIG. 6) mounted inside the carriages 70, the container may include openings through which air from the outside environment may flow into the container to cool the computing equipment 102. The container may also include openings through which air heated by the computing equipment 102 may exit the container into the outside environment. In such embodiments, some of the air cooling components of the vertical cooling systems 100A and 100B (see FIG. 5) may be omitted from the data center 10.

Figure 11:
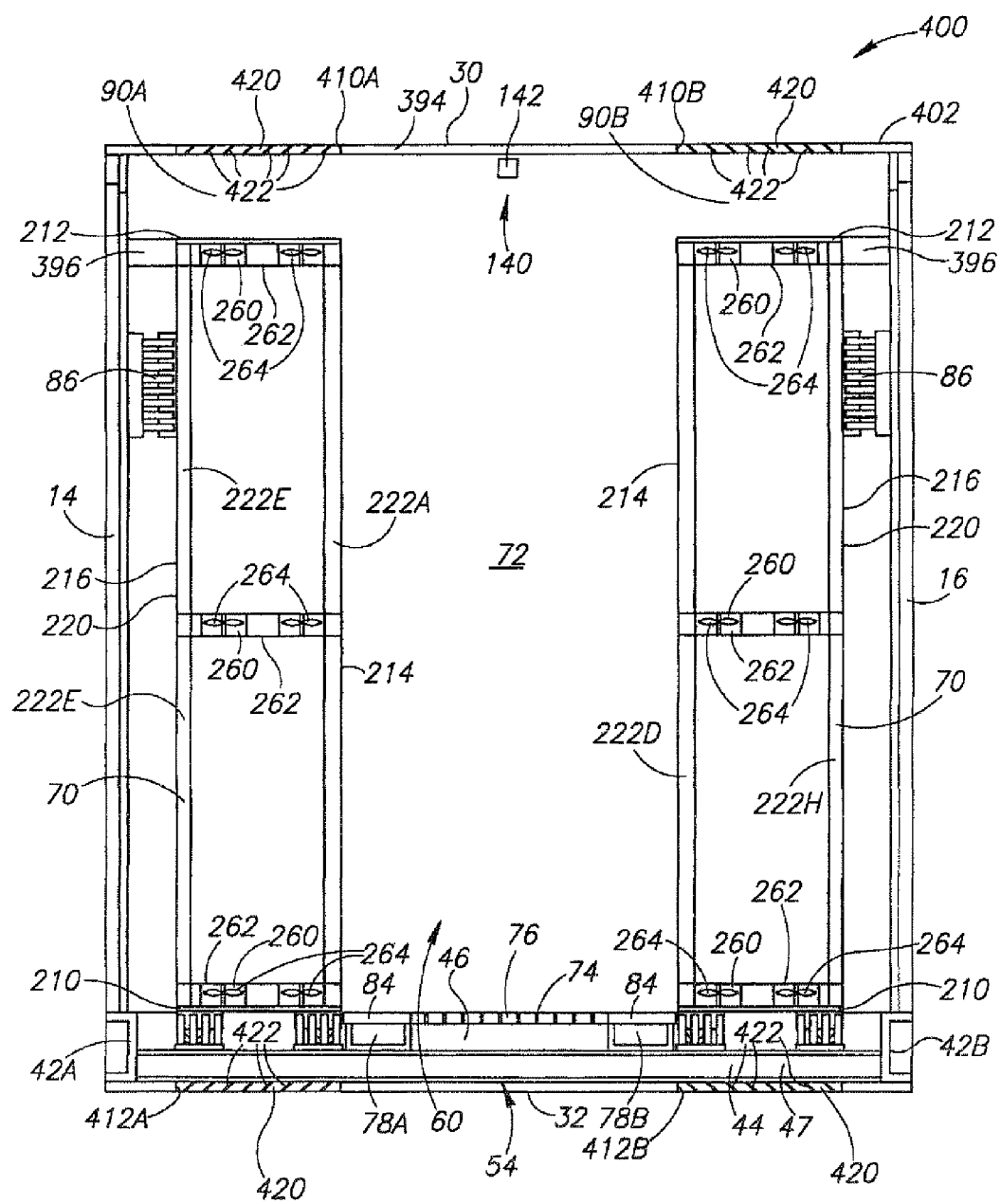
FIG. 11 is an enlarged fragmentary cross-sectional view of an alternate embodiment of a data center including openings and louvers along its roof and floor portions, omitting its electrical system, and taken laterally through the container.

FIG. 11 provides a data center 400 for use in an environment having a temperature suitable for cooling the computing equipment 102 (see FIG. 6) mounted inside the carriages 70. For ease of illustration, like reference numerals have been used to identify like components of the data center 400 and the data center 10 (see FIG. 5). The data center 400 includes a container 402, substantially similar to the container 12 (see FIG. 5). For ease of illustration, only aspects of the container 402 that differ from those of container 12 will be described in detail.

The container 402 includes a first plurality of upper openings 410A, a second plurality of upper openings 410B, a first plurality of lower openings 412A, and a second plurality of lower openings 412B. The first plurality of upper openings 410A and the first plurality of lower openings 412A extend along the first longitudinal side portion 14 of the container 402. The second plurality of upper openings 410B and the second plurality of lower openings 412B extend along the second longitudinal side portion 16 of the container 402. The first and second plurality of upper openings 410A and 410B provide open communication between the upper plenums 90A and 90B, respectively, and the environment outside the container 402. The first and second plurality of lower openings 412A and 412B provide open communication between the lower plenums 46 and the environment outside the container 402.

Cool air is drawn into the lower plenums 46 by the air moving assemblies 260 mounted inside the carriages 70 through the first and second plurality of lower openings 412A and 412B. Air heated by the computing equipment 102 (see FIG. 6) is pushed from the upper plenums 90A and 90B by the air moving assemblies 260 through the first and second plurality of upper openings 410A and 410B, respectively. In this embodiment, the humidity of the air inside the container 402 is controlled by controlling the humidity of the air outside the container 402.

Optionally, the data center 400 includes louvers 420. In the embodiment illustrated in FIG. 11, a single louver 420 is received inside each of the first and second plurality of upper openings 410A and 410B and a single louver 420 is received inside each of the first and second plurality of lower openings 412A and 412B. However, this is not a requirement.

In alternate implementations discussed below, the louvers 420 may cover the first and second plurality of upper openings 410A and 410B and the first and second plurality of lower openings 412A and 412B. By way of a non-limiting example, a first louver may cover a single one of the first plurality of upper openings 410A and a second different louver may cover a single one of the second plurality of upper openings 410B. Similarly, a third louver may cover a single one of the first plurality of lower openings 412A and a fourth louver may cover a single one of the second plurality of lower openings 412B. By way of another non-limiting example, a single louver may cover more than one of the first plurality of upper openings 410A, more than one of the second plurality of upper openings 410B, more than one of the first plurality of lower openings 412A, or more than one of the second plurality of lower openings 412B.

The louvers 420 may be selectively opened and closed to selectively transition the data center 400 between an open system state in which at least one of the louvers 420 is open and a closed system state in which all of the louvers 420 are closed. Based on the external environmental factors, the data center 400 may operate in the open system state to exploit "free air" cooling when appropriate and switch to the closed system state when necessary (e.g., the temperature of the air in the outside environment is too hot or too cold, the air in the outside environment is too humid, the air in the outside environment includes too many contaminants, and the like).

Figure 12:
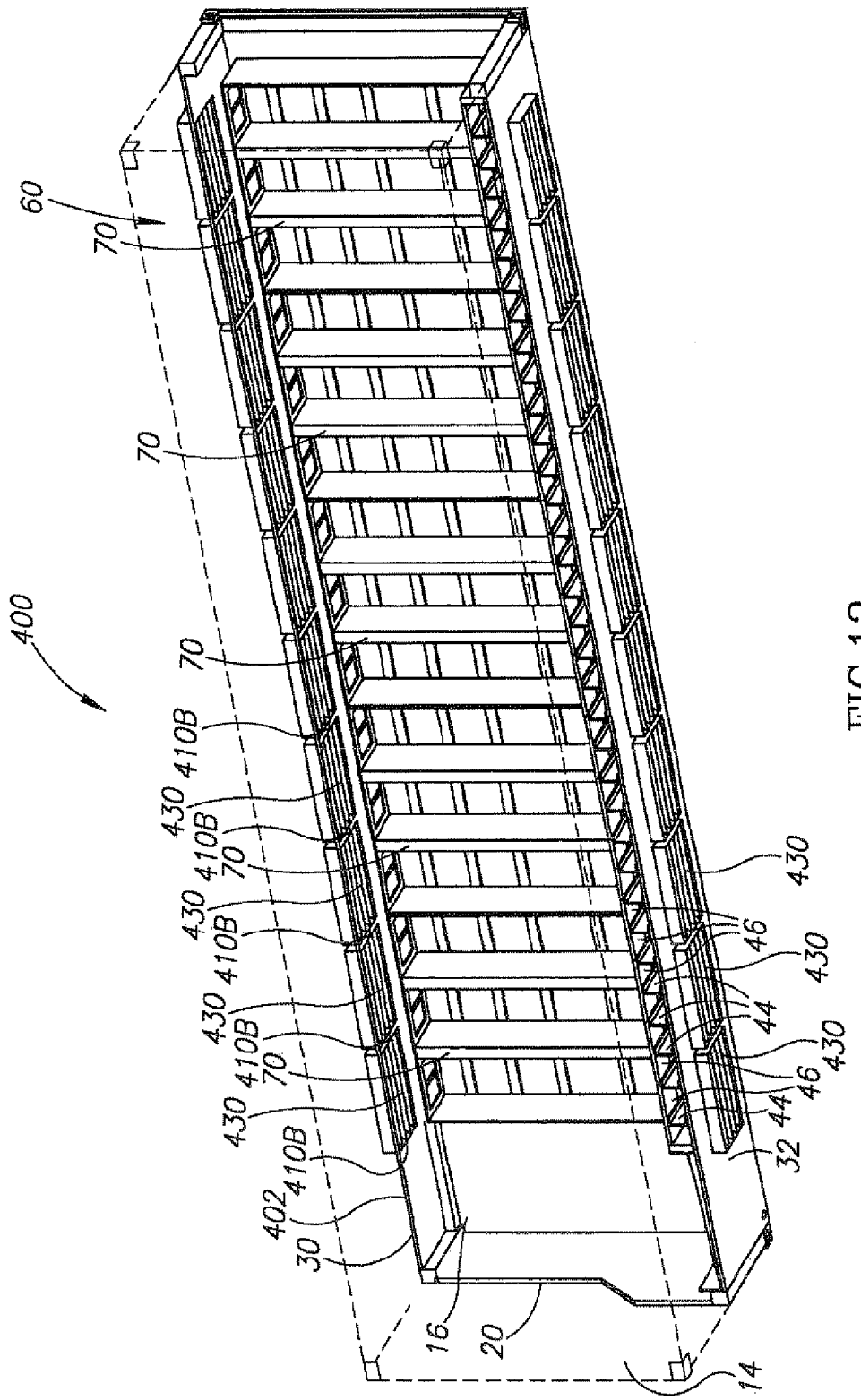
FIG. 12 is an enlarged fragmentary cross-sectional perspective view of the data center of FIG. 11 including alternate louvers along its roof and floor portions and, omitting its electrical system and portions of its vertical cooling systems, and taken longitudinally through the container.

Optionally, as illustrated in FIGS. 11 and 12, the data center 400 may omit the source 310 of cooled water, the chilled water/refrigerant heat exchanger 300, the refrigerant supply manifold 354, the refrigerant return manifold 356, the supply conduits 360, the return conduits 372, the refrigerant/air heat exchangers 370, the bent conduits 390, the T-shaped inlet valve 330, the T-shaped outlet valve 332, the first water line 318, the second water line 320, the inlet pipe 334, and the outlet pipe 336. In such embodiments, the data center 400 may remain in the open system state during operation and transition to a closed system state only when the computing equipment 102 (see FIG. 6) is powered down.

In some implementations, the louvers 420 are configured such that all of the louvers 420 are either open or closed at the same time. For example, each of the louvers 420 may include a plurality of blades 422 (illustrated in an open position) selectively openable and closable by a control switch (not shown). When the switch is placed in the closed position, all of the blades 422 of the louvers 420 are closed and when the switch is in the open position all of the blades 422 of the louvers 420 are open.

Optionally, the data center 400 includes one or more covers, chimneys, or similar structures (not shown) configured to allow air to flow from the first and second plurality of upper openings 410A and 410B and at the same time, prevent precipitation (rain, snow, etc) from entering the container 402 through the first and second plurality of upper openings 410A and 410B.

Referring to FIG. 12, an alternate embodiment of the louvers 420 is provided. Louvers 430 are configured to be coupled to the roof portion 30 of the container 402 adjacent the second plurality of upper openings 410B and to extend outwardly away from the roof portion 30 of the container 402. The louvers 430 are further configured to be coupled to the roof portion 30 of the container 402 adjacent the first plurality of upper openings 410A (see FIG. 11) and to extend outwardly away from the roof portion 30 of the container 402. The louvers 430 are also configured to be coupled to the floor portion 32 of the container 402 adjacent one or more of the second plurality of lower openings 412B and to extend outwardly away from the floor portion 32 of the container 402. The louvers 430 are further configured to be coupled to the floor portion 32 of the container 402 adjacent one or more of the first plurality of lower openings 412A (see FIG. 11) and to extend outwardly away from the floor portion 32 of the container 402.

Each of the louvers 430 include an assembly (not shown) configured to selectively open to provide air flow between the interior portion 60 of the container 402 and the outside environment and to selectively close to cutoff air flow between the interior portion 60 of the container 402 and the outside environment. The louvers 430 may be configured to be opened and closed at the same time using any method known in the art. Further, each of the louvers 430 may include a filter (not shown) configured to prevent contaminants and particulate matter (e.g., dust, insects, and the like) from entering the interior portion 60 of the container 402.

Figure 13:
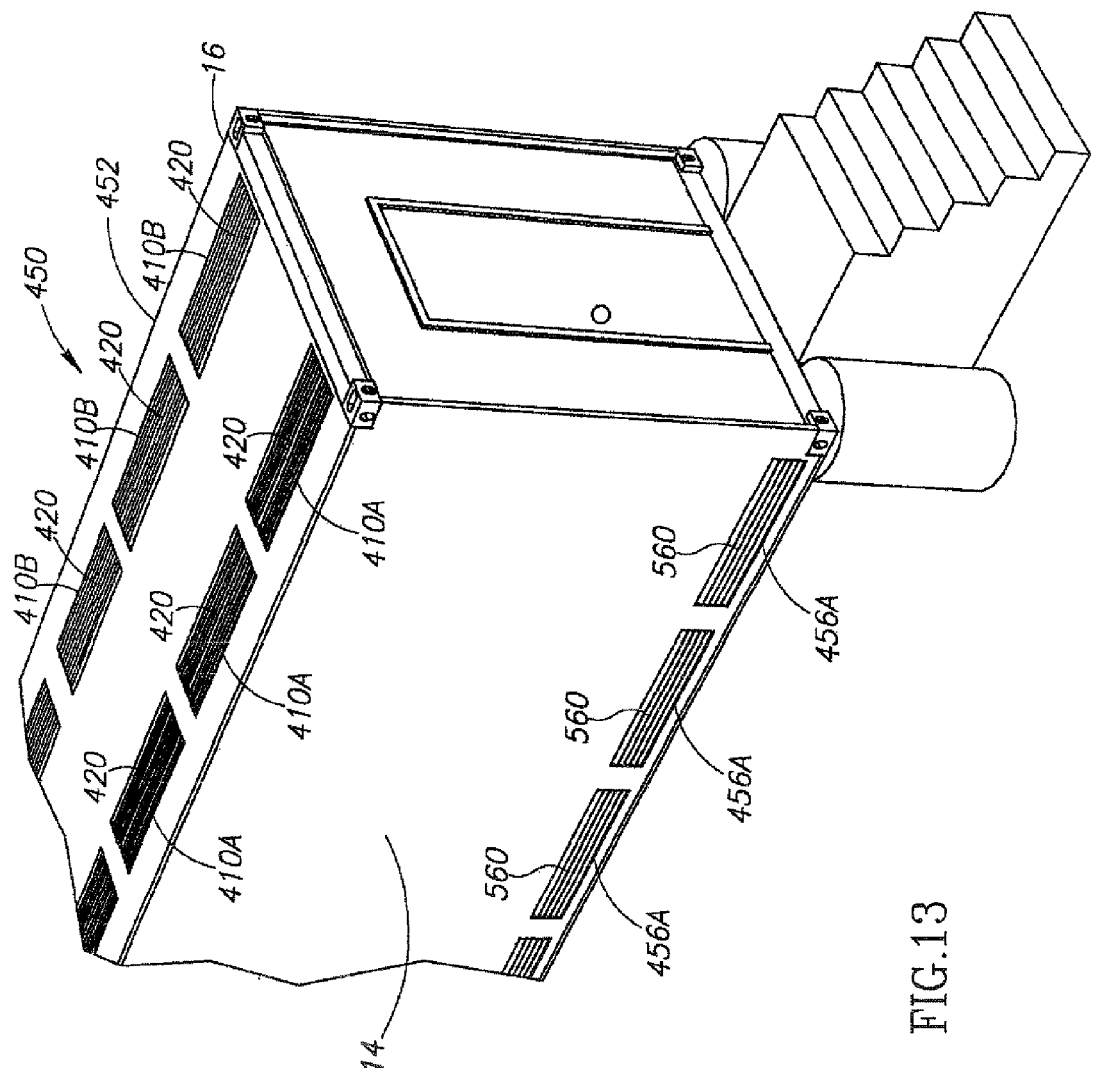
FIG. 13 is an enlarged fragmentary perspective view of alternate embodiment of a data center including openings and louvers along its roof portion and side portions.
Figure 14:
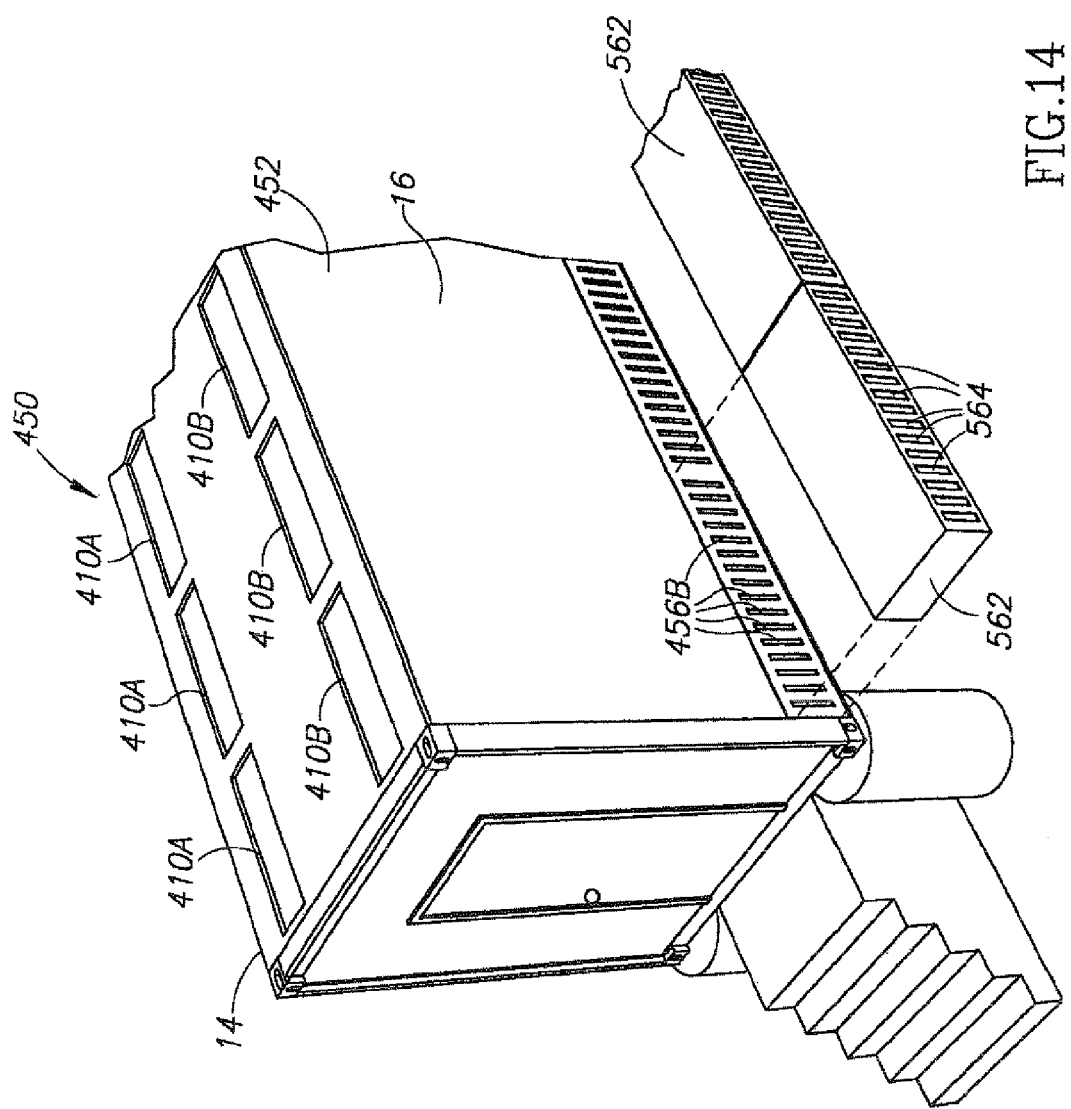
FIG. 14 is an enlarged fragmentary perspective view of the data center of FIG. 13 omitting louvers along its roof portion and including louver assemblies along its side portions.

FIGS. 13 and 14 provide a data center 450 for use in an environment having a temperature suitable for cooling the computing equipment 102 (see FIG. 6) mounted inside the carriages 70. For ease of illustration, like reference numerals have been used to identify like components of the data center 450 and the data centers 10 and 400. The data center 450 includes a container 452, substantially similar to the container 12 (see FIG. 1). For ease of illustration, only aspects of the container 452 that differ from those of container 12 will be described in detail.

Like the data center 400 (see FIGS. 11 and 12), the data center 450 includes the first and second plurality of upper openings 410A and 410B. However, the data center 450 omits the first and second plurality of lower openings 412A and 412B. Instead, the data center 450 includes a first plurality of side openings 456A and a second plurality of side openings 456B. The first plurality of side openings 456A extends along the first longitudinal side portion 14 of the container 452 and the second plurality of side openings 456B extends along the second longitudinal side portion 16 of the container 452.

The first and second plurality of side openings 456A and 456B provide open communication between the environment outside the container 452 and the lower plenums 46 (see FIG. 11). Cool air is drawn into lower plenums 46 by the air moving assemblies 260 (see FIG. 11) through the first and second plurality of side openings 456A and 456B. Air heated by the computing equipment 102 (see FIG. 6) is pushed from the upper plenums 90A and 90B (see FIG. 11) by the air moving assemblies 260 through the first and second plurality of upper openings 410A and 412B. In this embodiment, the humidity of the air inside the container 452 is controlled by controlling the humidity of the air outside the container 452.

In FIG. 13, a louver 420 is received inside each of the first and second plurality of upper openings 410A and 412B and the first and second plurality of side openings 456A and 456B are covered by louvers 560 substantially similar to the louvers 420. In FIG. 14, the first and second plurality of upper openings 410A and 412B are illustrated without louvers and the first and second plurality of side openings 456A and 456B are covered by louver assemblies 562 that extend outwardly away from the container 452.

Instead of blades, the louver assemblies 562 include openings or slots 564. Each of the louver assemblies 562 includes an assembly (not shown) configured to selectively open to provide air flow between the interior portion 60 of the container 452 and the outside environment and to selectively close to cutoff air flow between the interior portion 60 of the container 452 and the outside environment. The louver assemblies 562 may be configured to be opened and closed at the same time using any method known in the art. Further, each of the louver assemblies 562 may include a filter (not shown) configured to prevent particulate matter (e.g., dust, insects, and the like) from entering the interior portion 60 of the container 452.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Accordingly, the invention is not limited except as by the appended claims.

The invention claimed is:
1. A data center comprising:
   a container comprising an interior portion having a humidity;
   a network;
   a humidifier coupled to the network and disposed inside the interior portion of the container, the humidifier having a humidity sensor operable to detect the humidity inside the interior portion of the container and send a humidity signal over the network;
   a plurality of computing devices disposed inside the interior portion of the container and coupled to the network; and
   a controller coupled to the humidifier, the plurality of computing devices by the network, and an external network, the controller being operable to send instructions over the network to the plurality of computing devices, to receive the humidity signal, and based on the humidity signal received, instruct the humidifier to increase or decrease the humidity inside the container,
   wherein said controller coupled to the network connected to the external network controls both the computing devices and the environment inside the container, and
   wherein remote computing devices coupled to the external network communicate with the controller to receive humidity information from the controller and to instruct the controller to increase or decrease the humidity inside the container.

2. The data center of claim 1, wherein the controller is further configured to turn on or off selected ones of the plurality of computing devices.

3. The data center of claim 1, wherein said humidifier increase its water vapor output to increase the humidity inside said container or reduce its output to decrease the humidity inside said container.

4. The data center of claim 1, wherein said controller coupled to said network connected to the external network controls both the computing equipment and the environment inside said container, and remote computing devices coupled to said external network communicates with said controller to receive humidity information from said controller and to instruct said controller to increase or decrease the humidity inside said container.

5. The data center of claim 1, further comprising a dehumidifier coupled to the network and disposed inside the interior portion of the container.

6. The data center of claim 5, wherein said dehumidifier has a humidity sensor operable to detect the humidity inside the interior portion of the container and configured to send a humidity signal over the network.

7. A data center comprising:
a container comprising an interior portion having a humidity;
a network;
a humidity control unit coupled to the network and disposed inside the interior portion of the container, the humidity control unit having a humidity sensor operable to detect the humidity inside the interior portion of the container and send a humidity signal over the network;
a plurality of computing devices disposed inside the interior portion of the container and coupled to the network; and
a controller coupled to the humidity control unit, the plurality of computing devices by the network, and an external network, the controller being operable to send instructions over the network to the plurality of computing devices, to receive the humidity signal, and based on the humidity signal received, instruct the humidity control unit to increase or decrease the humidity inside the container,
wherein the humidity control unit performs the functions of a humidifier and a dehumidifier,
wherein said controller coupled to the network connected to the external network controls both the computing devices and the environment inside the container, and
wherein remote computing devices coupled to the external network communicate with the controller to receive humidity information from the controller and to instruct the controller to increase or decrease the humidity inside the container.

8. The data center of claim 7, wherein the controller is further configured to turn on or off selected ones of the plurality of computing devices.

9. The data center of claim 7, wherein said humidity control unit increases its water vapor output to increase the humidity inside said container or reduce its output to decrease the humidity inside said container.

* * * * *